US012796196B2

(12) United States Patent
Choi et al.

(10) Patent No.: US 12,796,196 B2
(45) Date of Patent: Nov. 10, 2026

(54) LIGHT EMITTING DEVICE PACKAGE AND DISPLAY DEVICE

(71) Applicant: LG ELECTRONICS INC., Seoul (KR)

(72) Inventors: Bongseok Choi, Seoul (KR); Joonkwon Moon, Seoul (KR); Sungjin Park, Seoul (KR); Taesu Oh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 567 days.

(21) Appl. No.: 18/283,721

(22) PCT Filed: Mar. 25, 2021

(86) PCT No.: PCT/KR2021/003706
§ 371 (c)(1),
(2) Date: Sep. 22, 2023

(87) PCT Pub. No.: WO2022/203099
PCT Pub. Date: Sep. 29, 2022

(65) Prior Publication Data

US 2024/0170433 A1 May 23, 2024

(51) Int. Cl.

| | |
|---|---|
| ***H10W 90/00*** | (2026.01) |
| ***H10H 20/857*** | (2025.01) |
| *H10W 70/652* | (2026.01) |
| *H10W 70/654* | (2026.01) |
| *H10W 90/10* | (2026.01) |

(52) U.S. Cl.
CPC .......... *H10H 20/857* (2025.01); *H10W 90/00* (2026.01); *H10W 70/6523* (2026.01); *H10W 70/654* (2026.01); *H10W 90/10* (2026.01)

(58) Field of Classification Search
CPC ............................ H10W 90/00; H10H 20/857
See application file for complete search history.

(56) References Cited

U.S. PATENT DOCUMENTS

| | | | |
|---|---|---|---|
| 2011/0210345 A1 | 9/2011 | Lim et al. |
| 2013/0020595 A1 | 1/2013 | Moriguchi et al. |
| 2018/0240937 A1 | 8/2018 | Park et al. |
| 2020/0235077 A1 | 7/2020 | Jeon et al. |

(Continued)

FOREIGN PATENT DOCUMENTS

| | | |
|---|---|---|
| CN | 206505948 U | 9/2017 |
| JP | 2013-26510 A | 2/2013 |

(Continued)

OTHER PUBLICATIONS

International Search Report (PCT/ISA/210) issued in PCT/KR2021/003706, dated Dec. 21, 2021.

*Primary Examiner* — Mark V Prenty
(74) *Attorney, Agent, or Firm* — Birch, Stewart, Kolasch & Birch, LLP

(57) ABSTRACT

A light emitting device package include a first layer; a plurality of light emitting devices on the first layer; a plurality of electrode pads surrounding the plurality of light emitting devices; a second layer on the plurality of light emitting devices; a plurality of connection electrodes disposed on the second layer to connect between the plurality of light emitting devices and the plurality of electrode pads, and a third layer on the plurality of connection electrodes.

18 Claims, 12 Drawing Sheets

(56) References Cited

U.S. PATENT DOCUMENTS

| | | | | |
|---|---|---|---|---|
| 2022/0367421 | A1 | 11/2022 | Ko et al. | |
| 2024/0170433 | A1* | 5/2024 | Choi | H10D 86/00 |

FOREIGN PATENT DOCUMENTS

| | | | |
|---|---|---|---|
| KR | 10-1014102 | B1 | 2/2011 |
| KR | 10-1039974 | B1 | 6/2011 |
| KR | 10-2017-0112776 | A | 10/2017 |
| KR | 10-2018-0081378 | A | 7/2018 |
| KR | 10-2018-0102424 | A | 9/2018 |
| KR | 10-2019-0092330 | A | 8/2019 |
| KR | 10-2060471 | B1 | 12/2019 |
| WO | WO 2017/034268 | A1 | 3/2017 |

* cited by examiner

[FIG. 1]
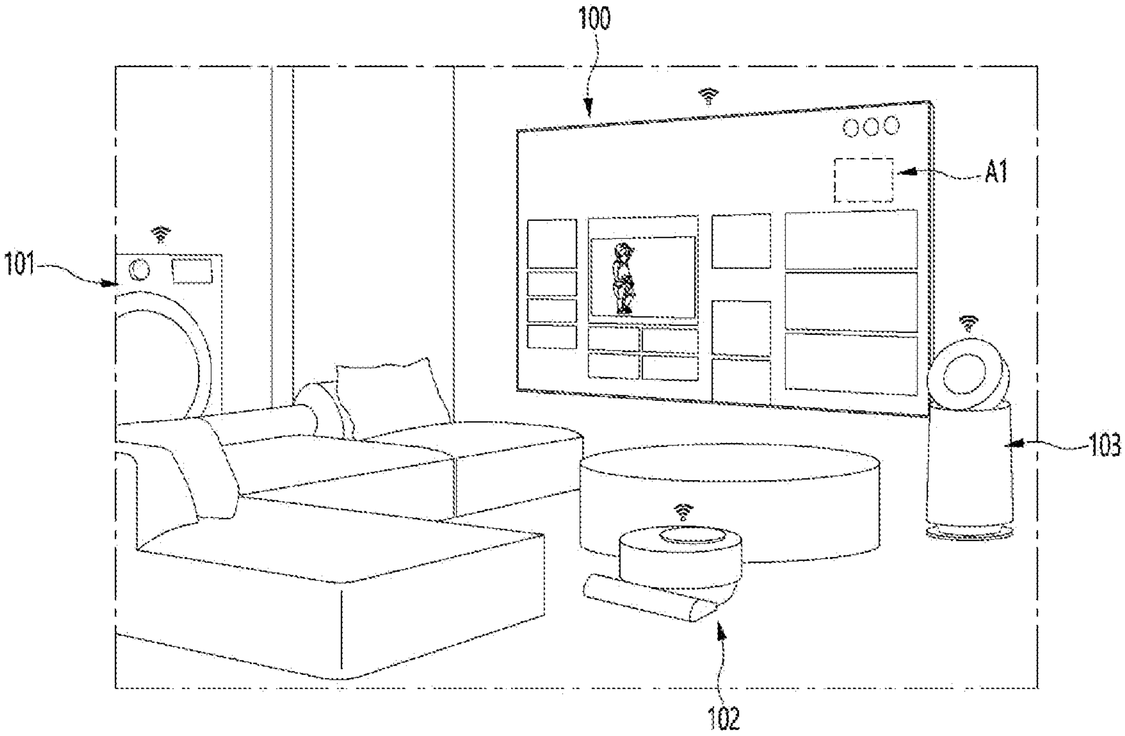

[FIG. 2]
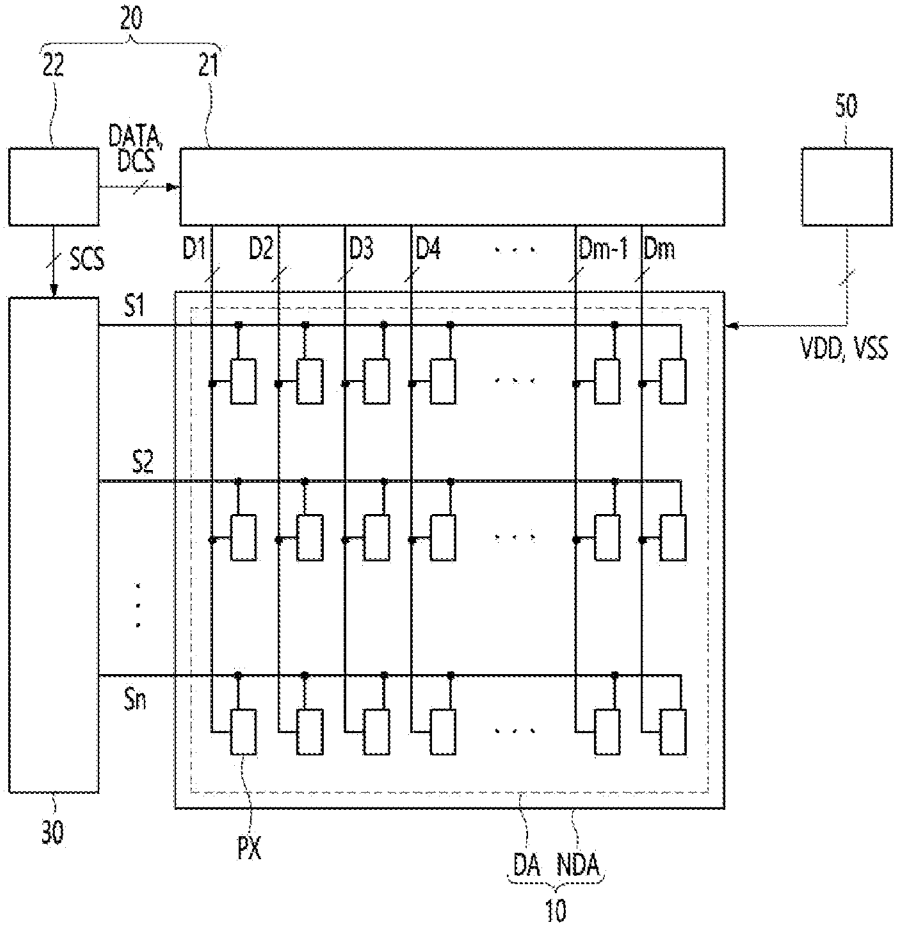

[FIG. 3]
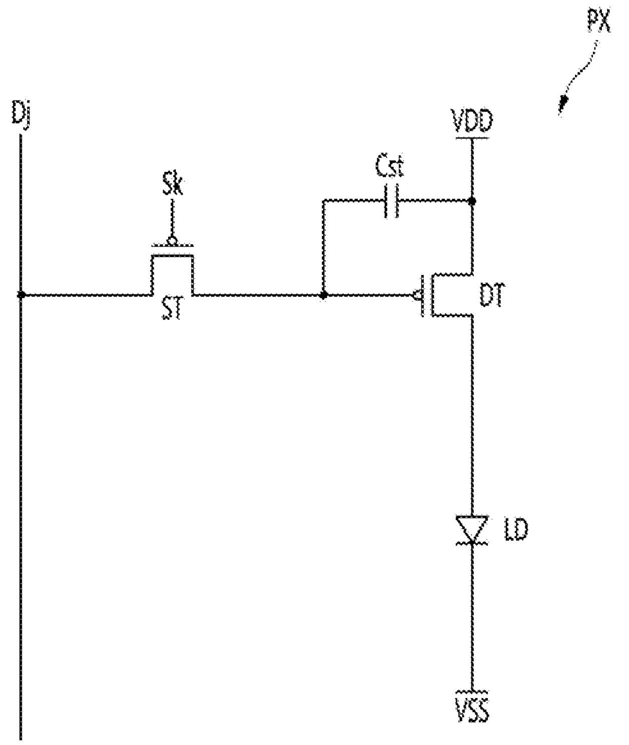
[FIG. 4]
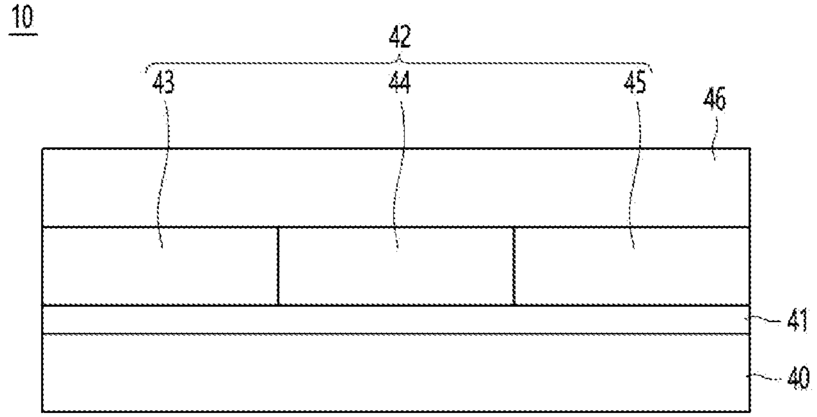

[FIG. 5]
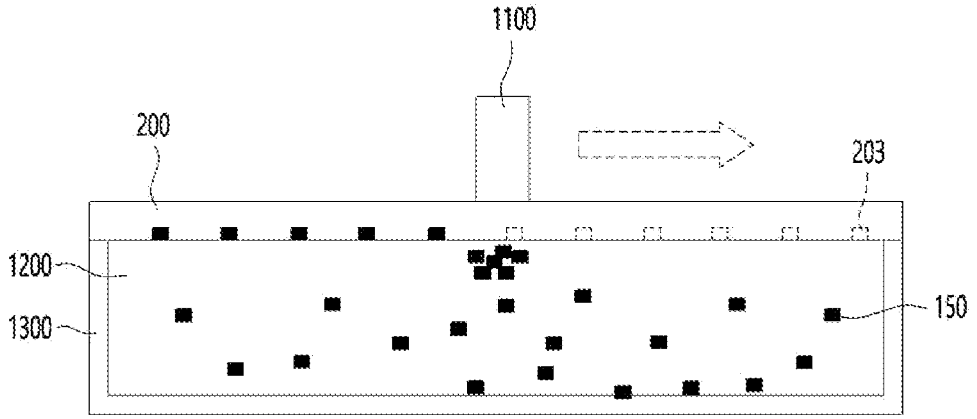

[FIG. 6]
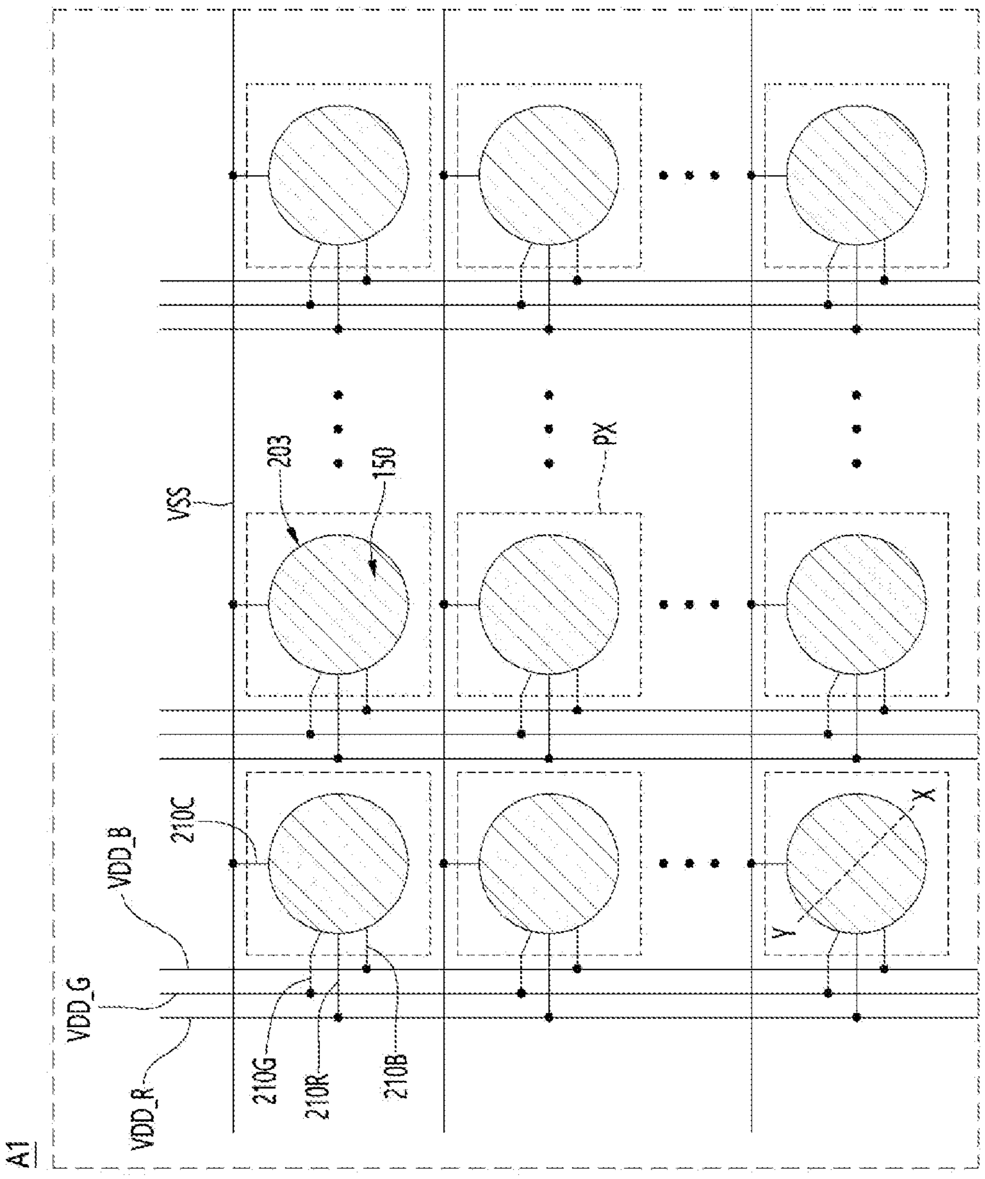

[FIG. 7]
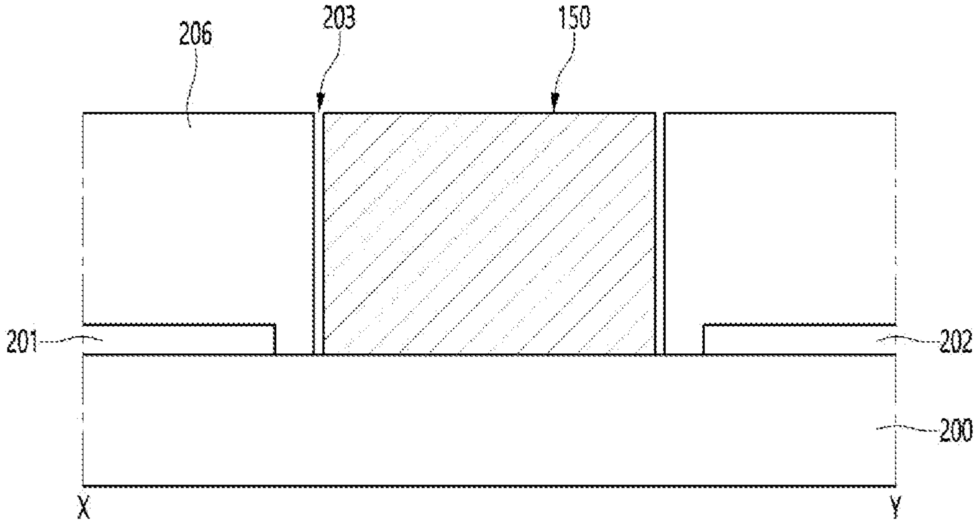
[FIG. 8]
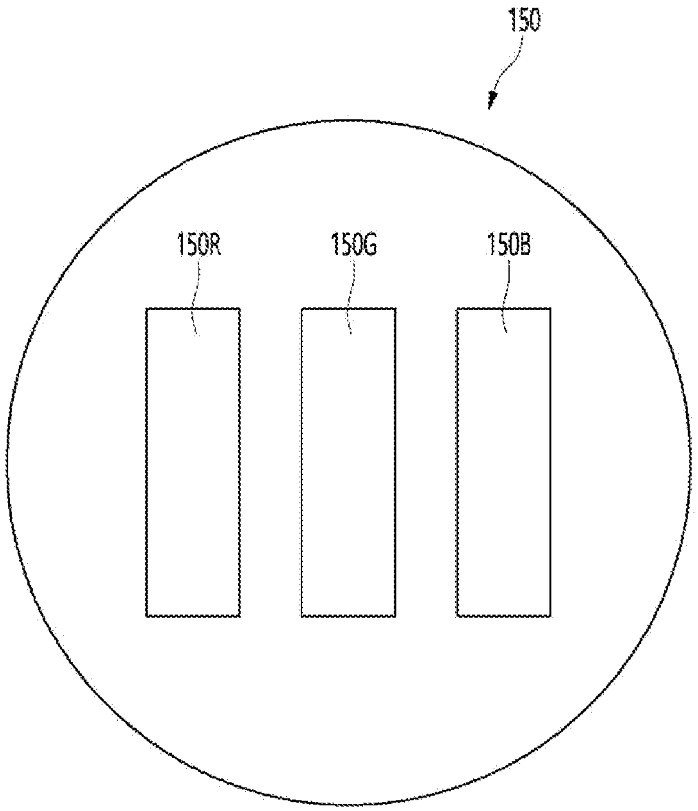

[FIG. 9]
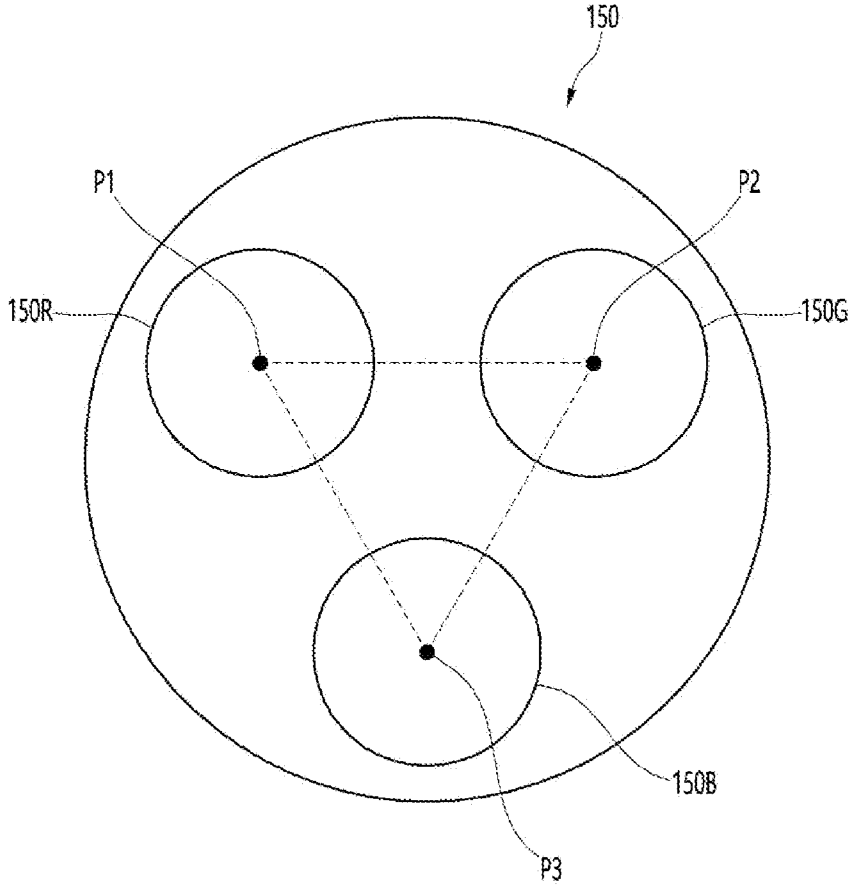

[FIG. 10]
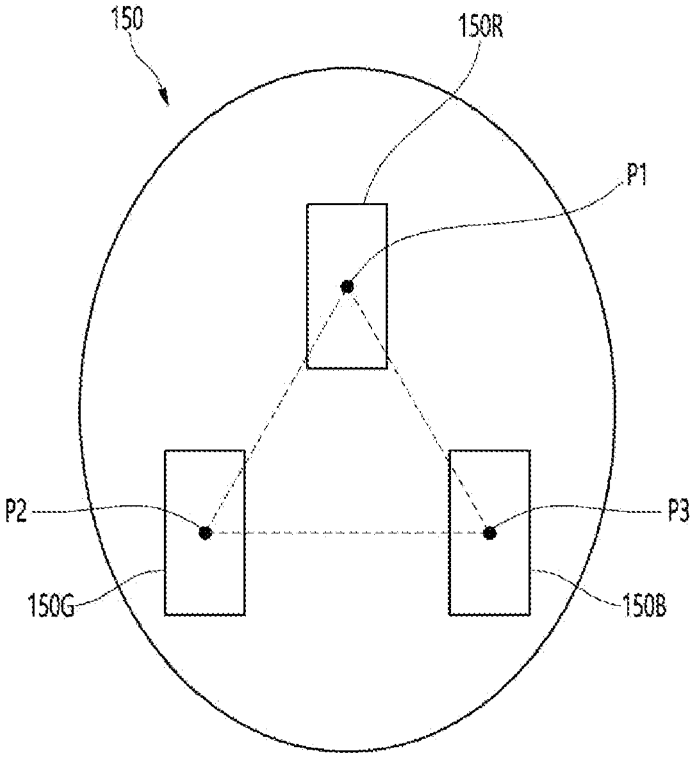

[FIG. 11]
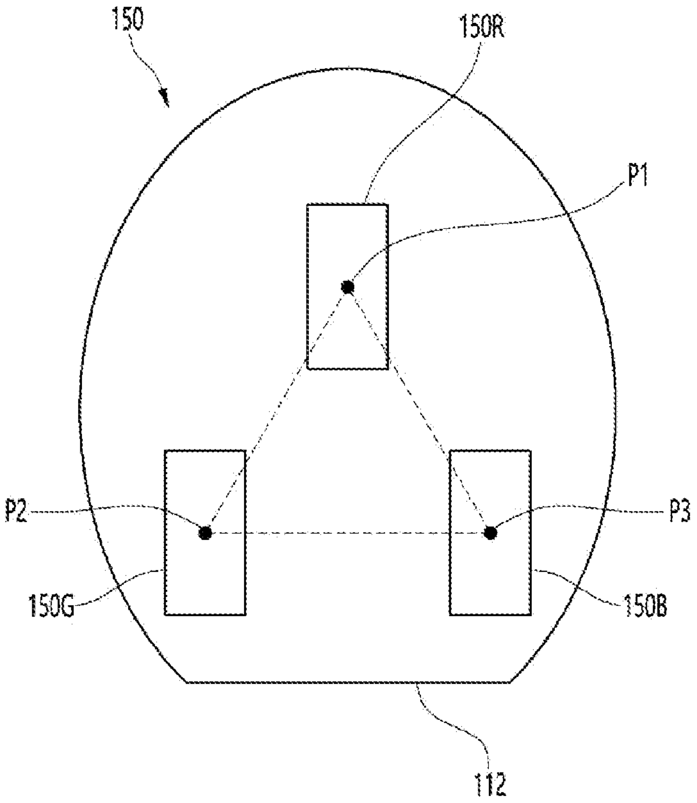

[FIG. 12]
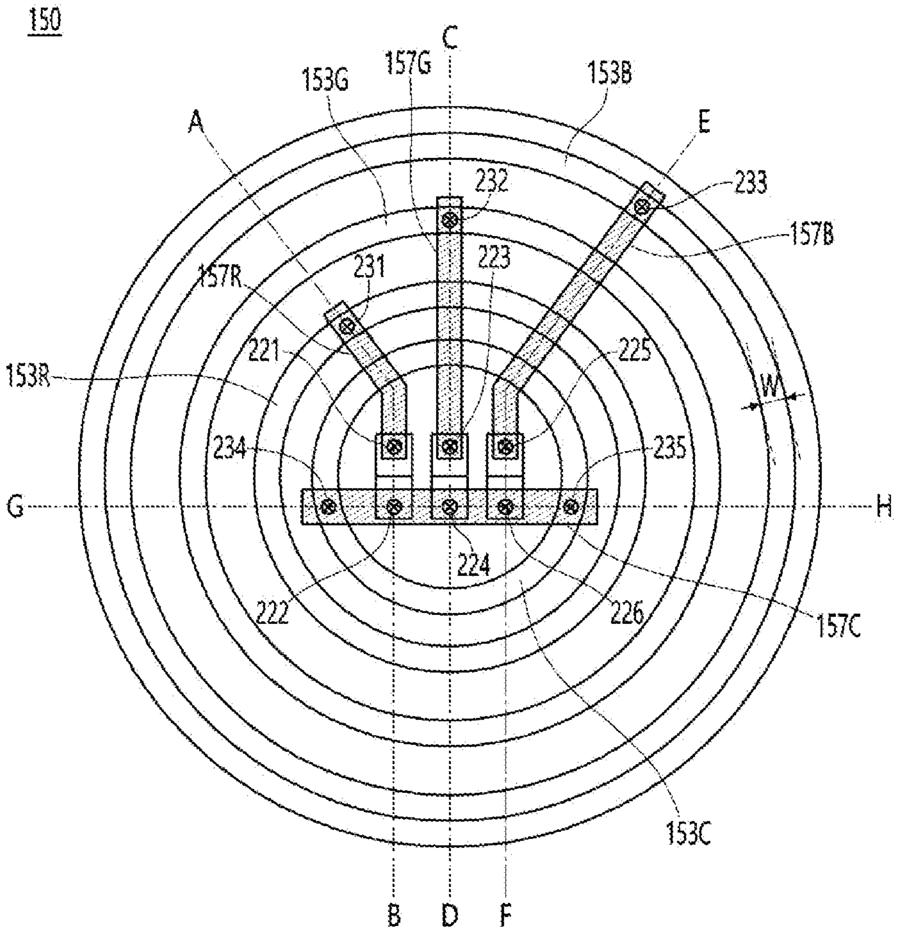
[FIG. 13]
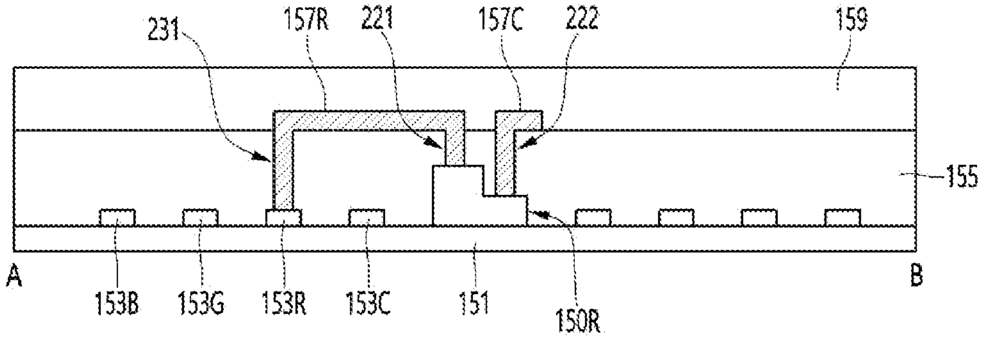

[FIG. 14]
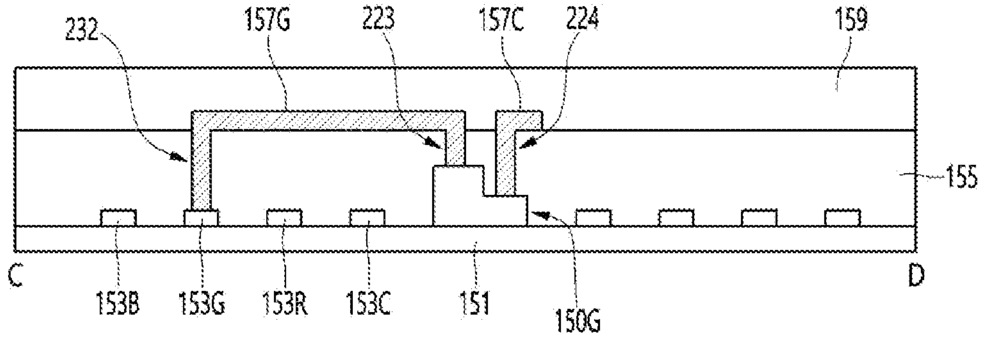
[FIG. 15]
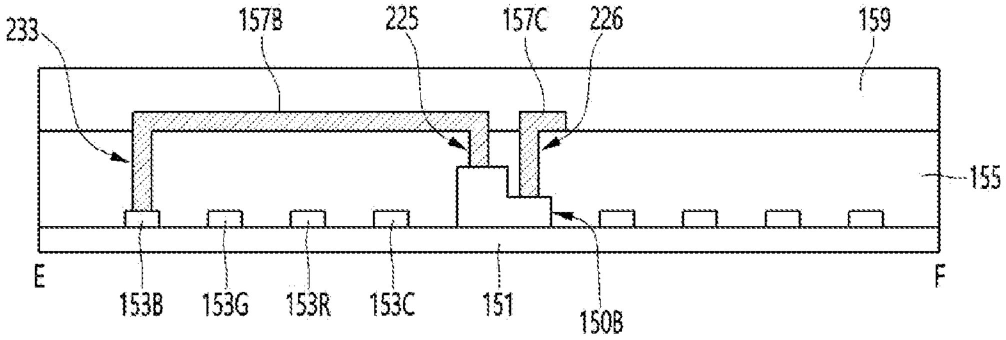
[FIG. 16]
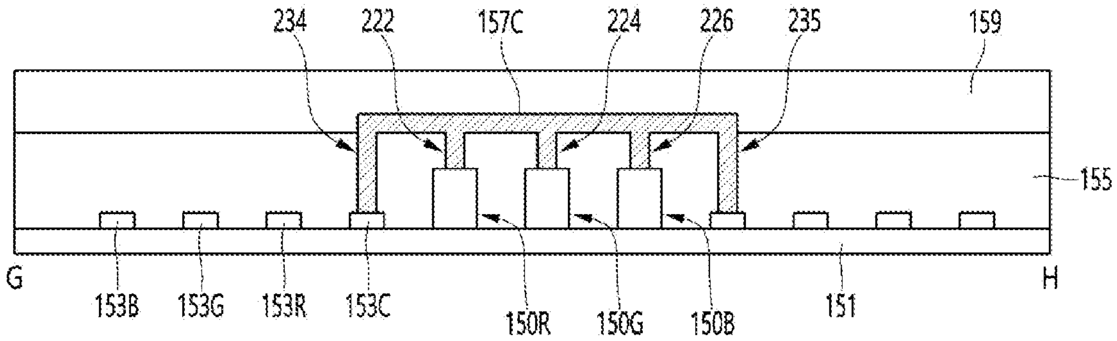

[FIG. 17]
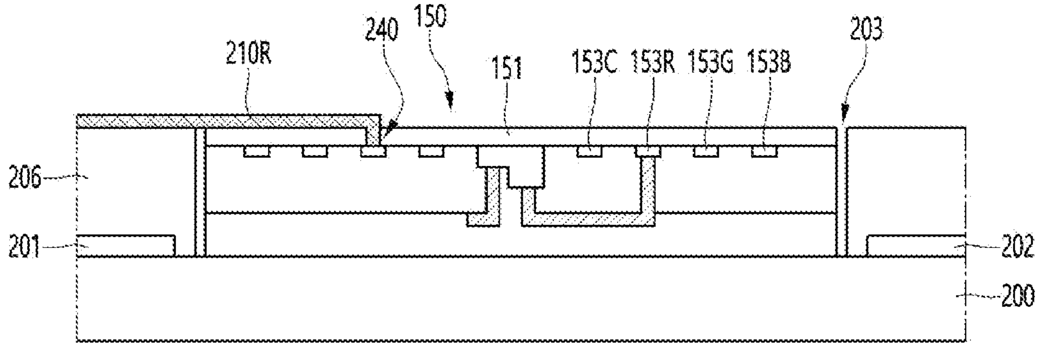

LIGHT EMITTING DEVICE PACKAGE AND DISPLAY DEVICE

CROSS REFERENCE TO RELATED APPLICATIONS

This application is the National Phase of PCT International Application No. PCT/KR2021/003706, filed on Mar. 25, 2021, all of which is hereby expressly incorporated by reference into the present application.

TECHNICAL FIELD

The embodiment relates to a light emitting device package and a display device.

BACKGROUND ART

A display device uses a self-light emitting device such as a light emitting diode as a light source of a pixel to display a high-definition image. Light emitting diodes exhibit excellent durability even under harsh environmental conditions, and are in the limelight as a light source for next-generation display devices because of their long lifespan and high luminance.

Recently, research is being conducted to manufacture a subminiature light emitting diode using a material having a highly reliable inorganic crystal structure and to use it as a next-generation pixel light source by placing it on a panel of a display device (hereinafter referred to as "display panel").

In order to realize high resolution, the pixel size is gradually getting smaller, and since a number of light emitting devices should be aligned in such a reduced size pixel, research into the manufacture of subminiature light emitting diodes as small as micro or nano scale is being actively conducted.

A typical display panel includes millions of pixels. Therefore, since it is very difficult to align light emitting devices in each of millions of small-sized pixels, various studies on arranging light emitting devices in a display panel have been actively conducted.

As the size of light emitting devices decreases, transferring these light emitting devices onto a substrate has become a very important problem. Transfer technologies that have recently been developed include a pick and place process, a laser lift-off method, or a self-assembly method. In particular, a self-assembly method in which a light emitting device is transferred onto a substrate using a magnetic material has recently been in the limelight.

In the normal self-assembly method, assembly is performed for each color light emitting device. That is, after the red light emitting devices are dropped and assembly is performed, the unassembled red light emitting devices are collected. Subsequently, green light emitting devices are dropped to perform assembling, and then unassembled green light emitting devices are collected. Subsequently, the blue light emitting device is dropped to perform assembling, and then the unassembled blue light emitting device is collected.

In this self-assembly method, since the dropping process, the assembly process, and the recovery process are performed for each of the red light emitting device, the green light emitting device, and the blue light emitting device, the process time is very long. In addition, when a light emitting device that has not been recovered in a previous process is assembled together with other light emitting devices, full color cannot be realized because the light emitting device emitting light of a different color is assembled in a specific color region.

In order to shorten the process time, a self-assembly method in which a red light emitting device, a green light emitting device, and a blue color light emitting device are simultaneously dropped and assembled has been proposed. In order to implement such a self-assembly method, each shape and size of a red light emitting device, a green light emitting device, and a blue light emitting device are different. Since the shape and size of the red light emitting device, the green light emitting device, and the blue light emitting device are different, the amount of light of the red light emitting device, the green light emitting device, and the blue light emitting device is different from each other, resulting in a decrease in color gamut.

DISCLOSURE

Technical Problem

Embodiments are aimed at solving the foregoing and other problems.

Another object of the embodiment is to provide a light emitting device package and a display device with maximized assembly freedom.

Another object of the embodiment is to provide a light emitting device package and a display device with maximized assembly efficiency.

Another object of the embodiment is to provide a light emitting device package and a display device maximizing the degree of freedom of electrical connection between a light emitting device and a signal line of a substrate.

Another object of the embodiment is to provide a light emitting device package and a display device capable of improving productivity.

Technical Solution

According to one aspect of the embodiment to achieve the above or other object, the light emitting device package includes a first layer; a plurality of light emitting devices on the first layer; a plurality of electrode pads surrounding the plurality of light emitting devices; a second layer on the plurality of light emitting devices; a plurality of connection electrodes disposed on the second layer to connect between the plurality of light emitting devices and the plurality of electrode pads, and a third layer on the plurality of connection electrodes.

According to another aspect of the embodiment, the display device includes a substrate including a plurality of grooves; a light emitting device package disposed in each of the grooves; a plurality of signal lines disposed adjacent to each of the plurality of grooves, and a plurality of connection lines connecting the plurality of signal lines and the plurality of packages, and the light emitting device package include a first layer; a plurality of light emitting devices on the first layer, and a plurality of electrode pads surrounding the plurality of light emitting devices.

Effects of the Invention

Effects of the light emitting device package and the display device according to the embodiment will be described.

According to at least one of the embodiments, since the outer surface of the light emitting device package is formed in a circular shape and the grooves of the substrate is formed to correspond to the shape of the light emitting device package, the light emitting device package can be easily inserted into the grooves of the substrate. As shown in FIGS. 6 and 12 to 17, the outer surface of the light emitting device package 150 can be formed in a circular shape, and the grooves 203 of the substrate 200 can also be formed to correspond to the shape of the light emitting device package 150. In this case, when the magnet is moved after the fluid is dropped on the light emitting device package 150, the light emitting device package 150 can be moved on the substrate 200 by the magnet and assembled into the corresponding grooves 203. When the light emitting device package 150 is moved by a magnet, the light emitting device package 150 can be moved in a state of being rotated in different directions based on the position of the grooves 203. Nevertheless, by forming the outer surface of the light emitting device package 150 in a circular shape and forming the grooves 203 of the substrate 200 to correspond to the shape of the light emitting device package 150, the light emitting device package 150 can be inserted into the grooves 203 even when the light emitting device package 150 is rotated in any direction by 360 degrees. Therefore, the probability that the light emitting device package 150 is assembled into the grooves 203 is significantly increased, and the assembly efficiency of the light emitting device package 150 is maximized and the assembly time is dramatically reduced, so that mass production of the display device 100 is possible.

According to at least one of the embodiments, in a light emitting device package having a first layer, a second layer, and a third layer, when a plurality of light emitting devices disposed on the second layer are connected to a plurality of electrode pads disposed on the third layer through the third layer, the light emitting device package is overturned in the grooves of the substrate and the third layer is placed in contact with the bottom surface of the grooves, so that the plurality of electrode pads can be connected to the plurality of signal lines through the first layer located on the upper side. When the light emitting device package is inserted into the grooves of the substrate without being turned over, a first layer of the light emitting device package is disposed to contact the bottom surface of the groove, and a plurality of electrode pads are connected to a plurality of signal lines through the third layer. in this case, since a plurality of connection electrodes for connecting a plurality of light emitting devices and a plurality of electrode pads as well as a plurality of connection lines for connecting a plurality of electrode pads and a plurality of signal lines are formed in the third layer, an electrical short can occur between the plurality of connection lines and the plurality of connection electrodes. Therefore, as shown in FIG. 17, the third layer of the light emitting device package 150 on which the plurality of connection electrodes 157R, 157G, 157B, 157C are disposed is directed toward the bottom surface of the grooves 203 so that the third layer 159 is in contact with the bottom surface of the grooves 203, a plurality of connection lines 210R, 210G, 210B, and 210C are formed on the first layer 151 located on the opposite side of the third layer 159, since the plurality of connection lines 210R, 210G, 210B, and 210C are not electrically shorted with the plurality of connection electrodes 157R, 157G, 157B, and 157C formed on the second layer 155, electrical connection failure can be prevented.

According to at least one of the embodiments, as shown in FIG. 12, annular electrode pads 153R, 153G, 153B, and 153C are formed on the light emitting device package 150, even if the light emitting device package 150 is distorted from the grooves 203 of the substrate 200 of the display device 200 and is out of position, the signal line of the substrate 200 can be freely connected to the electrode pad 153R, 153G, 153B, and 153C of the light emitting device package 150, there is an advantage in that electrical connectivity between the light emitting device package 150 and the substrate 200 of the display device 200 can be improved.

According to at least one of the embodiments, self-assembly is performed in units of a light emitting device package including a plurality of light emitting devices, conventionally, it is possible to solve problems caused by individually self-assembling a plurality of light emitting devices, that is, a long process time, defects due to unrecovered light emitting devices and color reproducibility deterioration caused by different sizes of each of a plurality of light emitting devices.

A further scope of applicability of the embodiment will become apparent from the detailed description below. However, since various changes and modifications within the spirit and scope of the embodiments can be clearly understood by those skilled in the art, it should be understood that the detailed description and specific embodiments, such as preferred embodiments, are given by way of example only.

DESCRIPTION OF DRAWINGS

FIG. 1 illustrates a living room of a house in which a display device according to an exemplary embodiment is disposed.

FIG. 2 is a schematic block diagram of a display device according to an exemplary embodiment.

FIG. 3 is a circuit diagram showing an example of a pixel of FIG. 2.

FIG. 4 is a schematic cross-sectional view of the display panel of FIG. 2.

FIG. 5 is a view showing an example in which a light emitting device package according to an embodiment is assembled to a substrate by a self-assembly method.

FIG. 6 is an enlarged view illustrating area A1 of FIG. 1.

FIG. 7 is a cross-sectional view taken along line X-Y of FIG. 6.

FIG. 8 is a first exemplary view of a light emitting device package according to an embodiment.

FIG. 9 is a second exemplary view of a light emitting device package according to an embodiment.

FIG. 10 is a third exemplary view of a light emitting device package according to an embodiment.

FIG. 11 is a fourth exemplary view of a light emitting device package according to an embodiment.

FIG. 12 is a plan view illustrating a light emitting device package according to an embodiment.

FIG. 13 is a cross-sectional view taken along line A-B of FIG. 12.

FIG. 14 is a cross-sectional view taken along the line C-D of FIG. 12.

FIG. 15 is a cross-sectional view taken along line E-F of FIG. 12.

FIG. 16 is a cross-sectional view taken along the line G-H of FIG. 12.

FIG. 17 is a cross-sectional view of a display device according to an embodiment.

MODE FOR INVENTION

Hereinafter, the embodiments disclosed herein will be described in detail with reference to the accompanying drawings, but the same or similar components are given the same reference numerals regardless of reference numerals, and overlapping descriptions thereof will be omitted. The suffixes 'module' and 'unit' for the components used in the following description are given or used interchangeably in consideration of ease of writing the specification, and do not themselves have a meaning or role that is distinct from each other. In addition, the accompanying drawings are for easy understanding of the embodiments disclosed in this specification, and the technical idea disclosed in this specification is not limited by the accompanying drawings. Also, when an element such as a layer, region or substrate is referred to as being 'on' another element, this includes being directly on the other element or other intervening elements can be present therebetween.

The display device described herein can include a mobile phone, a smart phone, a laptop computer, a digital broadcasting terminal, a personal digital assistants (PDAs) and a portable multimedia player (PMP), navigation, a slate PC, a tablet PC, an ultra-book, a digital TV, a desktop computer, and the like. However, the configuration according to the embodiment described in this specification can be applied to a display capable device even if it is a new product type to be developed in the future.

Hereinafter, a light emitting device package according to an embodiment and a display device including the same will be described.

FIG. 1 illustrates a living room of a house in which a display device according to an exemplary embodiment is disposed.

The display device 100 of the embodiment can display the status of various electronic products such as the washing machine 101, the robot cleaner 102, and the air purifier 103, and communicate with each electronic product based on IOT, and can control each electronic product based on the user's setting data.

The display device 100 according to the embodiment can include a flexible display manufactured on a thin and flexible substrate. The flexible display can be bent or rolled like paper while maintaining the characteristics of a conventional flat panel display.

In a flexible display, visual information can be implemented by independently controlling light emission of unit pixels arranged in a matrix form. A unit pixel means a minimum unit for realizing full color.

A unit pixel of the flexible display can include a light emitting device package including a plurality of light emitting devices. That is, at least one light emitting device package can be provided per unit pixel. For example, a unit pixel can be defined as first to third sub-pixels. For example, the light emitting device package can include a first light emitting device, a second light emitting device, and a third light emitting device. In this case, a first light is emitted from a first light emitting device as a first sub-pixel, a second light is emitted from a second light emitting device as a second sub-pixel, and a third light is emitted from a third light emitting device as a third sub-pixel. For example, the first light emitting device can be a red light emitting device, the second light emitting device can be a green light emitting device, and the third light emitting device can be a blue light emitting device, but is not limited thereto. For example, a fourth light emitting device can be further included as a white light emitting device in the light emitting device package.

In the embodiment, the light emitting device can be a Micro-LED, but is not limited thereto.

[Circuit of Display Device]

FIG. 2 is a block diagram schematically illustrating a display device according to an exemplary embodiment, and FIG. 3 is a circuit diagram illustrating an example of a pixel of FIG. 2.

Referring to FIGS. 2 and 3, the display device 100 according to the embodiment can include a display panel 10, a driving circuit 20, a scan driving unit 30, and a power supply circuit 50.

The display device 100 of the embodiment can drive the light emitting device package in an active matrix (AM) method or a passive matrix (PM) method.

The driving circuit 20 can include a data driver 21 and a timing controller 22.

The display panel 10 can have a rectangular shape on a plane. The planar shape of the display panel 10 is not limited to a rectangle, and can be formed into other polygonal, circular or elliptical shapes. At least one side of the display panel 10 can be formed to be bent with a predetermined curvature.

The display panel 10 can be divided into a display area DA and a non-display area NDA disposed around the display area DA. The display area DA is an area in which pixels PX are formed to display an image. The display panel 10 includes data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

A light emitting device package including a plurality of light emitting devices can be provided in the pixel PX.

Each of the pixels PX can be connected to three of the data lines D1 to Dm, three of the scan lines S1 to Sn, and a high potential voltage line VDD.

FIG. 3 illustrates a circuit related to one light emitting device among a plurality of light emitting devices of the light emitting device package included in the pixel PX.

As shown in FIG. 3, it can include a plurality of transistors and at least one capacitor for supplying current to one light emitting device LD among a plurality of light emitting devices. For example, the light emitting device LD shown in FIG. 3 may be a red light emitting device.

Other light emitting devices other than the red light emitting device of the light emitting device package can also be configured with a circuit similar to that of FIG. 3.

Each of the light emitting devices LD of the light emitting device package may be an inorganic light emitting diode including a first electrode, an inorganic semiconductor, and a second electrode. Here, the first electrode can be an anode electrode, and the second electrode may be a cathode electrode.

A plurality of transistors as shown in FIG. 13 can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst stores a difference voltage between the gate voltage and the source voltage of the driving transistor DT.

The driving transistor DT and the switching transistor ST can be formed of thin film transistors. In addition, in FIG. 3, the driving transistor DT and the switching transistor ST have been mainly described as being formed of P-type MOSFETs (Metal Oxide Semiconductor Field Effect Transistors), but the present invention is not limited thereto. The driving transistor DT and the switching transistor ST can be formed of N-type MOSFETs. In this case, positions of the source electrode and the drain electrode of each of the driving transistor DT and the switching transistor ST can be changed.

In addition, in FIG. 3 has been illustrated each of the first sub-pixel PX1, the second sub-pixel PX2, and the third sub-pixel PX3 includes one driving transistor DT, one scan transistor ST, and 2T1C (2 Transistor-1 capacitor) having a capacitor Cst, but the present invention is not limited thereto. A plurality of scan transistors ST and a plurality of capacitors Cst can be included to drive the corresponding light emitting device LD.

Referring back to FIG. 2, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system may be an application processor of a smartphone or tablet PC, a monitor, or a system-on-chip of a TV.

The timing controller 22 generates control signals for controlling operation timings of the data driver 21 and the scan driver 30. The control signals can include a source control signal DCS for controlling the operation timing of the data driver 21 and a scan control signal SCS for controlling the operation timing of the scan driver 30.

The driving circuit 20 can be disposed in the non-display area NDA provided on one side of the display panel 10. The driving circuit 20 can be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 can be mounted on a circuit board (not shown) instead of the display panel 10.

The data driver 21 is a COG (chip on glass) method, a COP (chip on plastic) method, or an ultrasonic bonding method, and can be mounted on the display panel 10 and the timing controller 22 can be mounted on a circuit board.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached to pads provided on one edge of the display panel 10 using an anisotropic conductive film. Due to this, the lead lines of the circuit board can be electrically connected to the pads. The circuit board can be a flexible printed circuit board, a printed circuit board, or a flexible film such as a chip on film. The circuit board can be bent under the display panel 10. Accordingly, one side of the circuit board can be attached to one edge of the display panel 10 and the other side can be disposed below the display panel 10 and connected to a system board on which a host system is mounted.

The power supply circuit 50 can generate voltages necessary for driving the display panel 10 from the main power applied from the system board and supply them to the display panel 10. For example, the power supply circuit 50 generates a high potential voltage (VDD) and a low potential voltage (VSS) for driving the light emitting devices (LD) of the display panel 10 from the main power supply, and can supply the high potential voltage line VDD and the low potential voltage line VSS of the display panel 10. In addition, the power supply circuit 50 can generate and supply driving voltages for driving the driving circuit 20 and the scan driving unit 30 from the main power.

Meanwhile, in the display device 100 according to the embodiment, a light emitting device package including a plurality of light emitting devices is used as a light source. Each of the plurality of light emitting devices of the light emitting device package of the embodiment is a self-emitting device that emits light by itself when electricity is applied, and can be a semiconductor light emitting device. Since the light emitting device of the embodiment is made of an inorganic semiconductor material, it is resistant to deterioration and has a semi-permanent lifespan, so it can contribute to the display device 100 implementing high-quality and high-definition images by providing stable light.

[Structure of the Display Panel]

FIG. 4 is a schematic cross-sectional view of the display panel of FIG. 2.

Referring to FIG. 4, the display panel 10 of the embodiment can include a first substrate 40, a light emitting unit 41, a color generating unit 42, and a second substrate 46. The display panel 10 of the embodiment can include more components than these, but is not limited thereto. The first substrate 40 can be the substrate 200 shown in FIG. 7.

Although not shown, at least one insulating layer can be disposed between the first substrate 40 and the light emitting part 41, between the light emitting unit 41 and the color generator 42 and/or between the color generator 42 and the second substrate 46, but is not limited thereto.

The first substrate 40 can support the light emitting unit 41, the color generating unit 42, and the second substrate 46. The second substrate 46 can include various elements as described above, for example, as shown in FIG. 2, data lines D1 to Dm (where m is an integer of 2 or greater), scan lines (S1 to Sn), a high potential voltage line (VDD) and a low potential voltage line (VSS), as shown in FIG. 3, a plurality of transistors and at least one capacitor, and as shown in FIG. 4, the first pad electrode 210 and the second pad electrode 220 can be formed.

The first substrate 40 can be formed of glass, but is not limited thereto.

The light emitting unit 41 can provide light to the color generating unit 42. The light emitting unit 41 can include a plurality of light sources that emit light themselves by applying electricity. For example, the light source can include a light emitting device package including a plurality of light emitting devices.

The light emitting device package can include a plurality of light emitting devices. A circuit associated with one of these plurality of light emitting devices is shown in FIG. 3.

For example, each of the plurality of light emitting devices of the light emitting device package can be arranged for each pixel and emit light independently by individual control for each pixel. Each of the plurality of light emitting devices of the light emitting device package can emit light of a different color. For example, in the light emitting device package, the first light emitting device can emit red light, the second light emitting device can emit green light, and the third light emitting device can emit blue light. The red light, green light, and blue light thus emitted can be emitted as red light, green light, and blue light through the color generator 42 to implement a desired color image.

As another example, each of the plurality of light emitting devices of the light emitting device package can be arranged for each pixel to simultaneously emit light from all pixels. All of the plurality of light emitting devices of the light emitting device package can emit light of the same color. For example, a plurality of light emitting devices of the light emitting device package can emit blue light, but can also emit white light or purple light. Accordingly, the blue light emitted from the plurality of light emitting devices of the light emitting device package is emitted as red light, green light, and blue light by the color generating unit 42, so that a desired color image can be implemented.

For example, each of light emitting device can include a group II-IV compound or a group III-V compound, but is not limited thereto. The III-V compound can be selected from the group including of a binary compound selected from the group including of GaN, GaP, GaAs, GaSb, AlN, AlP, AlAs, AlSb, InN, InP, InAs, InSb and mixtures thereof, a three-element compound selected from the group including of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group including of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The color generating unit 42 can generate light of a different color from the light provided by the light emitting unit 41.

For example, the color generator 42 can include a first color generator 43, a second color generator 44, and a third color generator 45. The first color generator 43 can correspond to the first sub-pixel PX1 of the pixel, the second color generator 44 can correspond to the second sub-pixel PX2 of the pixel, and the third color generator 45 can correspond to the third sub-pixel PX3 of the pixel.

The first color generating unit 43 can generate first color light based on the light provided from the light emitting unit 41, the second color generating unit 44 can generate second color light based on the light provided from the light emitting unit 41, and the third color generating unit 45 can generate third color light based on the light provided from the light emitting unit 41. For example, the first color generating unit 43 outputs blue light from the light emitting unit 41 as red light, the second color generator 44 outputs blue light from the light emitting unit 41 as green light, and the third color generator 45 outputs blue light from the light emitting unit 41 as it is.

For example, the first color generator 43 can include a first color filter, and the second color generator 44 can include a second color filter, and the third color generator 45 can include a third color filter The first color filter, the second color filter, and the third color filter can be formed of a transparent material through which light can pass.

For example, at least one of the first color filter, the second color filter, and the third color filter can include a quantum dot.

The quantum dot of the embodiment can be selected from a group II-IV compound, a group IV-VI compound, a group IV element, a group IV compound, and a combination thereof.

The II-VI compound can be selected from the group including of a binary compound selected from the group including of CdSe, CdTe, ZnS, ZnSe, ZnTe, ZnO, HgS, HgSe, HgTe, MgSe, MgS and mixtures thereof, a three-element compound selected from the group including of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and quaternary compounds selected from the group including of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The III-V compound can be selected from the group including of a binary compound selected from the group including of GaN, GaP, GaAs, GaSb, AlN, AlP, AlAs, AlSb, InN, InP, InAs, InSb and mixtures thereof, a three-element compound selected from the group including of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group including of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The IV-VI compound can be selected from the group including of a binary compound selected from the group including of SnS, SnSe, SnTe, PbS, PbSe, PbTe and mixtures thereof, a three-element compound selected from the group including of SnSeS, SnSeTe, SnSTe, PbSeS, PbSeTe, PbSTe, SnPbS, SnPbSe, SnPbTe and mixtures thereof and quaternary compounds selected from the group including of SnPbSSe, SnPbSeTe, SnPbSTe and mixtures thereof.

Group IV elements can be selected from the group including of Si, Ge, and mixtures thereof. The group IV compound can be a binary element compound selected from the group including of SiC, SiGe, and mixtures thereof.

These quantum dots can have a full width of half maximum (FWHM) of an emission wavelength spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nanoplatelet particles, etc. but, is not limited to this.

For example, when all of the plurality of light emitting devices of the light emitting device package emit blue light, the first color filter can include red quantum dots, and the second color filter can include green quantum dots. The third color filter may not include quantum dots, but is not limited thereto. For example, blue light from the light emitting device can be absorbed by the first color filter, and the absorbed blue light can be wavelength-shifted by red quantum dots to output red light. For example, blue light from the light emitting device is absorbed by the second color filter, and the wavelength of the absorbed blue light is shifted by the green quantum dots to output green light. For example, blue light from a foot and an element can be absorbed by the third color filter, and the absorbed blue light can be emitted as it is.

Meanwhile, when all of the plurality of light emitting devices of the light emitting device package emit white light, not only the first color filter and the second color filter but also the third color filter can include quantum dots. That is, the wavelength of white light of the light emitting device 150 can be shifted to blue light by the quantum dots included in the third color filter.

For example, at least one of the first color filter, the second color filter, and the third color filter can include a phosphor. For example, some of the first color filters, the second color filters, and the third color filters can include quantum dots, and others can include phosphors. For example, each of the first color filter and the second color filter can include a phosphor and a quantum dot. For example, at least one of the first color filter, the second color filter, and the third color filter can include scattering particles. Since blue light incident on each of the first color filter, the second color filter, and the third color filter is scattered by the scattering particles and the color of the scattered blue light is shifted by the corresponding quantum dots, light output efficiency can be improved.

As another example, the first color generator 43 can include a first color conversion layer and a first color filter. The second color generator 44 can include a second color converter and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can contact the upper surface of the first color conversion layer and have the same size as the first color conversion layer, but is not limited thereto. For example, the second color filter can contact the upper surface of the second color conversion layer and have the same size as the second color conversion layer, but is not limited thereto. For example, the third color filter can contact the upper surface of the third color conversion layer and have the same size as the third color conversion layer, but is not limited thereto.

For example, the first color conversion layer can include red quantum dots, and the second color conversion layer can include green quantum dots. The third color conversion layer may not include quantum dots. For example, the first color filter can include a red-based material that selectively transmits the red light converted in the first color conversion layer, the second color filter can include a green-based material that selectively transmits the green light converted in the second color conversion layer, and the third color filter can include a blue-based material that selectively transmits blue light transmitted through the third color conversion layer as it is.

Meanwhile, when all of the plurality of light emitting devices of the light emitting device package emit white light, not only the first color conversion layer and the second color conversion layer, but also the third color conversion layer can include quantum dots. That is, the wavelength of white light of the light emitting device 150 can be shifted to blue light by the quantum dots included in the third color filter.

Referring back to FIG. 4, the second substrate 46 can be disposed on the color generator 42 to protect the color generator 42. The second substrate 46 can be formed of glass, but is not limited thereto.

The second substrate 46 can be called a cover window, a cover glass, or the like.

The second substrate 46 can be formed of glass, but is not limited thereto.

[Self-Assembly Method]

FIG. 5 is a diagram illustrating an example in which a light emitting device package according to an embodiment is assembled to a substrate by a self-assembly method.

Referring to FIG. 5, an example in which the light emitting device package 150 according to the embodiment is assembled to the substrate 200 by a self-assembly method using an electromagnetic field will be described.

Referring to FIG. 5, the substrate 200 can be a panel substrate of a display device or a temporary donor substrate for transfer. That is, the light emitting device package 150 assembled on the donor substrate can be transferred to the panel substrate.

In the following description, the substrate 200 is described as a panel substrate of the display device 100, but the embodiment is not limited thereto.

The substrate 200 can be formed of glass or polyimide. In addition, the substrate 200 can include a flexible material such as polyethylene naphthalate (PEN) or polyethylene terephthalate (PET). In addition, the substrate 200 can be a transparent material, but is not limited thereto.

The light emitting device package 150 can be put into the chamber 1300 filled with the fluid 1200. The fluid 1200 can be water such as ultrapure water, but is not limited thereto. A chamber can also be called a water bath, container, vessel, or the like.

Thereafter, the substrate 200 can be disposed on the chamber 1300. Depending on the embodiment, the substrate 200 can be introduced into the chamber 1300.

A pair of wiring lines 201 and 202 corresponding to each of the light emitting device packages 150 to be assembled can be formed on the substrate 200.

The first wiring lines 201 and 202 can be formed of a transparent electrode (ITO) or can include a metal material having excellent electrical conductivity. For example, the wiring lines 201 and 202 can be formed of at least one of titanium (Ti), chromium (Cr), Nickel (Ni), Aluminum (Al), Platinum (Pt), Gold (Au), Tungsten (W), or Molybdenum (Mo) or an alloy thereof.

The first electrode and the second electrode emit an electric field as voltage is applied, the first electrode and the second electrode can function as a pair of assembly electrodes for fixing the assembled light emitting device package 150 to the grooves 203 on the substrate 200. The grooves 203 serves to guide the light emitting device package 150 to be easily assembled in a specific area, and can be called an assembly hole.

The distance between the wiring lines 201 and 202 is smaller than the width of the light emitting device package 150 and the width of the grooves 203, so that the assembly position of the light emitting device package 150 using an electric field can be more accurately fixed.

An insulating member 206 is formed on the wiring lines 201 and 202, and the insulating member can protect the wiring lines 201 and 202 from the fluid 1200 and prevent current flowing through the wiring lines 201 and 202 from leaking. The insulating member 206 can be formed of a single layer or multiple layers of an inorganic insulator such as silica or alumina or an organic insulator.

In addition, the insulating member 206 can include an insulating and flexible material such as polyimide, PEN, or PET, and can be integrated with the substrate 200 to form a single substrate.

The insulating member 206 can be an adhesive insulating layer or a conductive adhesive layer having conductivity. Since the insulating member 206 is flexible, the flexible function of the display device 100 can be enabled.

For example, when forming the substrate 200, a portion of the insulating member 206 can be removed, thereby forming a grooves 203 in which each of the light emitting device packages 150 are assembled to the substrate 200.

Grooves 203 to which the light emitting device packages 150 are coupled are formed in the substrate 200, and a surface on which the grooves 203 are formed can contact the fluid 1200. The grooves 203 can guide an accurate assembly position of the light emitting device package 150.

Meanwhile, the grooves 203 can have a shape and size corresponding to the shape of the light emitting device package 150 to be assembled at the corresponding position. Accordingly, it is possible to prevent assembly of other light emitting devices or a plurality of light emitting devices into the grooves 203.

Referring back to FIG. 5, after the substrate 200 is disposed, the assembly device 1100 including a magnetic material can move along the substrate 200. As the magnetic material, for example, a magnet or an electromagnet can be used. The assembly device 1100 can move while in contact with the substrate 200 in order to maximize the area of the magnetic field into the fluid 1200. Depending on the embodiment, the assembly device 1100 can include a plurality of magnetic bodies or can include a magnetic body having a size corresponding to that of the substrate 200. In this case, the moving distance of the assembling device 1100 can be limited within a predetermined range.

The light emitting device package 150 in the chamber 1300 can move toward the assembly device 1100 by the magnetic field generated by the assembly device 1100.

While moving toward the assembly device 1100, the light emitting device package 150 can enter the grooves 203 and come into contact with the substrate 200.

At this time, by the dielectrophoretic force formed by the electric field applied by the wiring lines 201 and 202 formed on the substrate 200, the separation of the light emitting device package 150 in contact with the substrate 200 due to the movement of the assembly device 1100 can be prevented.

Therefore, since the time required for assembling each of the light emitting device packages 150 to the substrate 200 can be drastically reduced by the above-described self-assembly method using the electromagnetic field, so that a large-area high-pixel display can be realized more quickly and economically.

On the other hand, the embodiment, by packaging a plurality of light emitting devices constituting a unit pixel to form a single light emitting device package 150 and assembling the light emitting device package 150 on the substrate 200 of the display device 200, so that assembly efficiency can be maximized.

According to the embodiment, the outer surface of the light emitting device package 150 has a circular shape, so that it can be easily assembled into the corresponding grooves 203 of the substrate 200 of the display device 200. And the light emitting device package 150 is freely rotatable within the grooves 203, so that the degree of freedom in the assembly direction of the light emitting device package 150 can be maximized.

In the embodiment, annular electrode pads 153R, 153G, 153B, and 153C are formed on the light emitting device package 150, even if the light emitting device package 150 is distorted from the grooves 203 of the substrate 200 of the display device 200 and is out of position, since the signal line of the substrate 200 can be freely connected to the electrode pads 153R, 153G, 153B, and 153C of the light emitting device package 150, electrical connectivity between the light emitting device package 150 and the substrate 200 of the display device 200 can be improved.

In the embodiment, by assembling the light emitting device package 150 including a plurality of light emitting devices, the process time is remarkably shortened compared to conventional assembling each light emitting device, and mass production is possible.

FIG. 6 is an enlarged view illustrating area A1 of FIG. 1, and FIG. 7 is a cross-sectional view taken along line X-Y of FIG. 6.

Referring to FIGS. 1, 6 and 7, the display device 100 according to the embodiment can include a substrate 200, a light emitting device package 150, and a plurality of signal lines VDD_R, VDD_G, VDD_B, and VSS.

The substrate 200 can serve as a support member for supporting various components of the display device 100.

For example, the substrate 200 can have rigid characteristics. For example, the substrate 200 can have a flexible property. For example, the substrate 200 can have a stretchable property. For example, the substrate 200 can have a rollable property. In addition, the substrate 200 can have various characteristics such as strength and warpage.

For example, the substrate 200 can be glass. For example, the substrate 200 can be a resin material. For example, the substrate 200 can be a plastic material. In addition, the substrate 200 can be formed of various materials.

In the display device 100 according to the embodiment, the substrate 200 can be a single substrate. In the display device 100 according to the embodiment, the substrate 200 can include a plurality of substrates connected to each other. In the display device 100 according to the embodiment, the substrate 200 can include at least one or more layers.

A first wiring line 201 and a second wiring line 202 can be disposed on the substrate 200. The first wiring line 201 and the second wiring line 202 can be spaced apart from each other, face each other, and can be parallel to each other, but are not limited thereto. The first wiring line 201 and the second wiring line 202 can generate dielectrophoretic force so that the light emitting device package 150 can be easily assembled to the grooves 203.

The grooves 203 is an area where the light emitting device package 150 is positioned, and can guide the light emitting device package 150 to be easily assembled and stably maintained within the corresponding grooves 203.

In the self-assembly method, the light emitting device package 150 is dropped into a fluid, and the light emitting device package 150 dropped into the fluid can be moved along the magnet or electromagnet by movement of the magnet or electromagnet. In this way, the moving light emitting device package 150 is inserted into the grooves of the substrate 200. Since the light emitting device package 150 inserted into the corresponding grooves 203 is not fixed to the substrate 200, it can escape out of the grooves 203 again. In order to prevent such separation, a dielectrophoretic force is generated by an electric field applied between the first wiring line 201 and the second wiring line 202, and the light emitting device package 150 can be fixed to the grooves 203 by this dielectrophoretic force.

The insulating member 206 can be disposed on the entire area of the substrate 200. The insulating member 206 can serve to prevent an electrical short between the first wiring line 201 and the second wiring line 202. The insulating member 206 can be made of an organic material, but is not limited thereto.

The insulating member 206 can be a planarization layer. That is, the insulating member 206 can be relatively thick and have a flat top surface. Accordingly, the step formed by the first wiring line 201, the second wiring line 202, and the blocking member 210 is removed, so that a member can be easily and accurately formed on the insulating member 206 by a post-process during a later process.

A plurality of grooves 203 can be formed in the insulating member 206. For example, an insulating film can be formed on the first wiring line 201 and the second wiring line 202, and the grooves 203 can be formed by etching to have a size corresponding to the light emitting device package 150. The size of the grooves 203 can be equal to or larger than the size of the light emitting device package 150.

Although not shown, another insulating member can be formed between the first wiring line 201 and the insulating member 206 and between the second wiring line 202 and the insulating member 206. Another insulating member can have dielectric properties, but is not limited thereto.

For example, the depth of the grooves 203 can be the same as the thickness of the light emitting device package 150. In this case, when the light emitting device package 150 is inserted into the grooves 203, the upper surface of the grooves 203 and the light emitting device package 150 can be aligned horizontally.

For example, the depth of the grooves 203 can be smaller than the thickness of the light emitting device package 150. In this case, when the light emitting device package 150 is inserted into the grooves 203, the upper surface of the light emitting device package 150 can be positioned higher than the upper surface of the grooves 203.

For example, at least one grooves 203 can be provided for each unit pixel. Since the light emitting device package 150 is assembled to the grooves 203, at least one light emitting device package 150 can be disposed for each unit pixel.

For example, when two light emitting device packages 150 are provided for each unit pixel, one light emitting device package among these light emitting device packages 150 can be a dummy light emitting device package to replace a malfunctioning light emitting device package when another light emitting device package is out of order.

For example, the grooves 203 can be provided in a matrix form. For example, since pixels are arranged in a matrix form to implement a display, the grooves 203 can also be provided in a matrix form. In this way, at least one light emitting device package 150 can be disposed in each of the grooves 203 arranged in a matrix form.

The light emitting device package 150 can be disposed in the grooves 203. The light emitting device package 150 will be described in detail later.

A plurality of signal lines (VDD_R, VDD_G, VDD_B, and VSS) can be disposed adjacent to the grooves 203. That is, some of the signal lines VSS can be disposed along the first direction, that is, the horizontal direction, and some other signal lines VDD_R, VDD_G, and VDD_B can be disposed along the second direction, that is, the vertical direction. Among the plurality of signal lines VDD_R, VDD_G, VDD_B, and VSS, some other signal lines VDD_R, VDD_G, and VDD_B can include three signal lines. The second direction can cross the first direction. Accordingly, some of the signal lines VSS and other signal lines VDD_R, VDD_G, and VDD_B can cross each other.

As shown in FIG. 6, three signal lines, that is, first to third signal lines VDD_R, VDD_G, and VDD_B can be disposed on the left side of each of the grooves 203. One signal line, that is, a fourth signal line VSS can be disposed above each of the grooves 203.

For example, the first to third signal lines VDD_R, VDD_G, and VDD_B can be the high potential voltage lines VDD shown in FIG. 2, and the fourth signal line VSS can be the low potential voltage line VSS. For example, high potential voltages supplied to each of the first to third signal lines VDD_R, VDD_G, and VDD_B can be different. For example, the low potential voltage supplied to the fourth signal line VSS can be 0V or a negative (−) voltage.

The plurality of signal lines VDD_R, VDD_G, VDD_B, and VSS can be electrically connected to the plurality of light emitting devices of the light emitting device package 150 through the plurality of connection lines 210R, 210G, 210B, and 210C. Such specific connection arrangement and connection method will be described later in detail.

Hereinafter, various light emitting device packages according to embodiments will be described.

[Various Aspects of the Light Emitting Device Package]

FIG. 8 is a first exemplary view of a light emitting device package according to an embodiment.

As shown in FIG. 8, the light emitting device package 150 according to the embodiment can include a plurality of light emitting devices 150R, 150G, and 150B. For example, the plurality of light emitting devices can include, for example, a red light emitting device 150R emitting red light, a green light emitting device 150G emitting green light, and a blue light emitting device 150B emitting blue light, but it is not limited to this.

The light emitting device package 150 can have a circular shape when viewed from above. For example, the side of the light emitting device package 150 can have a circular shape when viewed from above.

The plurality of light emitting devices 150R, 150G, and 150B can be disposed along one direction when viewed from above. For example, the plurality of light emitting devices 150R, 150G, and 150B can be arranged side by side from left to right. That is, the red light emitting device 150R is disposed, the green light emitting device 150G is disposed apart from the red light emitting device 150R, and the blue light emitting device 150B is disposed apart from the green light emitting device 150G.

For example, each of the plurality of light emitting devices 150R, 150G, and 150B can have a rectangle when viewed from above, but can have other shapes. That is, each of the plurality of light emitting devices 150R, 150G, and 150B can have a circular shape, an elliptical shape, a star shape, a polygonal shape, and the like when viewed from above.

Since the light emitting device package 150 of the embodiment has a circular shape and the grooves 203 of the substrate 200 also has a shape corresponding to the shape of the light emitting device package 150, so that the light emitting device package 150 can be easily assembled into the grooves 203 of the substrate 200.

If the grooves 203 of the substrate 200 and the light emitting device package 150 are rectangular, since the corner of the light emitting device package 150 is at an angle of 90 degrees, it is difficult to easily assemble into the grooves 203 of the substrate 200.

However, as in the embodiment, since the grooves 203 of the substrate 200 and the light emitting device package 150 are circular, and thus each side of the grooves 203 of the substrate 200 and the light emitting device package 150 has a round surface, the circular side surface of the light emitting device package 150 can be easily assembled to the circular inner surface of the grooves 203 of the substrate 200.

FIG. 9 is a second exemplary view of a light emitting device package according to an embodiment.

As shown in FIG. 9, the light emitting device package 150 according to the embodiment can include a plurality of light emitting devices 150R, 150G, and 150B.

The light emitting device package 150 can have a circular shape when viewed from above. For example, the side of the light emitting device package 150 can have a circular shape when viewed from above.

The plurality of light emitting devices 150R, 150G, and 150B can be disposed at vertices P1, P2, and P3 of a triangle when viewed from above. For example, the center of each of the plurality of light emitting devices 150R, 150G, and 150B can coincide with the vertexes P1, P2, and P3 of the triangle.

The vertices P1, P2, and P3 of the triangle can be set in consideration of the radius of each of the plurality of light emitting devices 150R, 150G, and 150B and the distance between each of the plurality of light emitting devices 150R, 150G, and 150B.

When the light emitting device package 150 is circular, the triangle can be an equilateral triangle, but is not limited thereto.

Each of the plurality of light emitting devices 150R, 150G, and 150B can have a circular shape when viewed from above, but is not limited thereto. For example, side surfaces of each of the plurality of light emitting devices 150R, 150G, and 150B can have a circular shape when viewed from above. Although not shown, the plurality of light emitting devices 150R, 150G, and 150B can have a quadrangular shape, an elliptical shape, a star shape, a polygonal shape, and the like when viewed from above.

Since the light emitting device package 150 of the embodiment has a circular shape and the grooves 203 of the substrate 200 also has a shape corresponding to the shape of the light emitting device package 150, so that the light emitting device package 150 can be easily assembled into the grooves 203 of the substrate 200.

According to the embodiment, since each of the plurality of light emitting devices 150R, 150G, and 150B of the light emitting device package 150 has a circular shape and has a radially uniform amount of light, when the display device 100 is manufactured using the corresponding light emitting device package 150, the viewing angle can be uniform and the viewing angle can be improved.

FIG. 10 is a third exemplary view of a light emitting device package according to an embodiment.

As shown in FIG. 10, the light emitting device package 150 according to the embodiment can include a plurality of light emitting devices 150R, 150G, and 150B.

The light emitting device package 150 can have an elliptical shape when viewed from above. For example, the side of the light emitting device package 150 can have an oval shape when viewed from above.

The plurality of light emitting devices 150R, 150G, and 150B can have a rectangular shape when viewed from above, but can have other shapes. That is, each of the plurality of light emitting devices 150R, 150G, and 150B can have a circular shape, an elliptical shape, a star shape, a polygonal shape, and the like when viewed from above.

The plurality of light emitting devices 150R, 150G, and 150B can be disposed at vertices P1, P2, and P3 of a triangle when viewed from above. For example, the center of each of the plurality of light emitting devices 150R, 150G, and 150B can coincide with the vertexes P1, P2, and P3 of the triangle.

The vertices P1, P2, and P3 of the triangle can be set in consideration of the radius of each of the plurality of light emitting devices 150R, 150G, and 150B and the separation distance of each of the plurality of light emitting devices 150R, 150G, and 150B.

When the light emitting device package 150 has an elliptical shape, the triangle can be an isosceles triangle, but is not limited thereto.

Since the light emitting device package 150 of the embodiment has an elliptical shape and the grooves 203 of the substrate 200 also has a shape corresponding to the shape of the light emitting device package 150, so that the light emitting device package 150 can be easily assembled into the grooves 203 of the substrate 200.

FIG. 11 is a fourth exemplary view of a light emitting device package according to an embodiment.

FIG. 11 can be the same as FIG. 10 except for the assembly guide surface 112.

As shown in FIG. 11, the light emitting device package 150 according to the embodiment can include a plurality of light emitting devices 150R, 150G, and 150B.

The light emitting device package 150 can have an elliptical shape when viewed from above. The plurality of light emitting devices 150R, 150G, and 150B can have a rectangular shape when viewed from above. When viewed from above, the plurality of light emitting devices 150R, 150G, and 150B can be disposed at vertices P1, P2, and P3 of the triangle.

One side of the light emitting device package 150 can have an assembly guide surface 112. The assembly guide surface 112 can serve to guide the plurality of light emitting devices 150R, 150G, and 150B of the light emitting device package 150 to be assembled in proper positions.

For example, as shown in FIG. 10, when the light emitting device package 150 does not have the assembly guide surface 112, whereas the red light emitting device 150R of the light emitting device package 150 faces the first side in a certain grooves 203 of the substrate 200, in addition, the red light emitting device 150R of the light emitting device package 150 can be positioned in the other grooves 203 of the substrate 200 to face a second side opposite to the first side. Accordingly, the red light emitting device 150R of the light emitting device package 150 disposed in the plurality of grooves 203 of the substrate 200 can be in a normal position or out of position.

For example, as shown in FIG. 11, when the light emitting device package 150 has an assembly guide surface 112, the red light emitting device 150R of the light emitting device package 150 can be positioned in the right position by the assembly guide surface 112 for each grooves 203 of the substrate 200.

Hereinafter, a light emitting device package according to an embodiment will be described with reference to FIGS. 12 to 16.

[Light Emitting Device Package of the Embodiment]

FIG. 12 is a plan view illustrating a light emitting device package according to an embodiment. FIG. 13 is a cross-sectional view taken along line A-B of FIG. 12. FIG. 14 is a cross-sectional view taken along line C-D of FIG. 12. FIG. 15 is a cross-sectional view taken along the line E-F of FIG. 12. FIG. 16 is a cross-sectional view taken along the line G-H of FIG. 12.

Referring to FIGS. 12 to 16, the light emitting device package 150 according to the embodiment can have a circular shape when viewed from above. For example, the side of the light emitting device package 150 can have a circular shape when viewed from above. For example, side surfaces of the light emitting device package 150 forming a circle can be spaced apart from the center of the light emitting device package 150 by the same radius along a radial direction.

For example, as will be described later, a grooves (203 in FIGS. 5 and 17) into which the light emitting device package 150 is assembled can be provided on the substrate 200. The grooves 203 can have an inner surface corresponding to the side surface of the light emitting device package 150. That is, the grooves 203 can have a circular shape when viewed from above.

When the light emitting device package 150 according to the embodiment is assembled to the grooves 203 of the substrate 200, the light emitting device package 150 can be inserted into the grooves 203. In this case, the inner surface of the grooves 203 can face the outer surface of the light emitting device package 150 face to face. An outer surface of the light emitting device package 150 can be in contact with an inner surface of the grooves 203 or can be spaced apart from the inner surface of the grooves 203.

One surface of the light emitting device package 150 can be in contact with the bottom surface of the grooves 203. As will be described later with reference to FIG. 17, the third layer 159 of the light emitting device package 150 can contact the bottom surface of the grooves 203.

According to the embodiment, the outer surface of the light emitting device package 150 can be formed in a circular shape, and the grooves 203 of the substrate 200 can also be formed to correspond to the shape of the light emitting device package 150. In this case, when the magnet is moved after the fluid is dropped on the light emitting device package 150, the light emitting device package 150 can be moved on the substrate 200 by the magnet and assembled into the corresponding grooves 203. When the light emitting device package 150 is moved by a magnet, the light emitting device package 150 can be moved in a state of being rotated in different directions based on the position of the grooves 203. Nevertheless, by forming the outer surface of the light emitting device package 150 in a circular shape and forming the grooves 203 of the substrate 200 to correspond to the shape of the light emitting device package 150, the light emitting device package 150 can be inserted into the grooves 203 even when the light emitting device package 150 is rotated in any direction by 360 degrees. Therefore, the probability that the light emitting device package 150 is assembled into the grooves 203 is significantly increased, and the assembly efficiency of the light emitting device package 150 is maximized and the assembly time is dramatically reduced, so that mass production of the display device 100 is possible.

Hereinafter, a detailed configuration of the light emitting device package 150 will be described.

Light emitting device package 150 according to the embodiment can include a first layer 151, a plurality of light emitting devices 150R, 150G, and 150B, a plurality of electrode pads 153R, 153G, 153B, and 153C, a second layer 155, a plurality of connection electrodes 157R, 157G, 157B, and 157C, and a third layer 159.

The first layer 151 to the third layer 159 can be insulating members. For example, the first layer 151 to the third layer 159 can be made of an organic material, an inorganic material, or a resin material.

The first layer 151 can be a support layer that supports components formed on the first layer 151, that is, the plurality of light emitting devices 150R, 150G, and 150B, a plurality of electrode pads 153R, 153G, 153B, and 153C, a second layer 155, a plurality of connection electrodes 157R, 157G, 157B, and 157C, and a third layer 159.

When the light emitting device package 150 is transferred onto the display substrate 200 via the donor substrate, the first layer 151 can be a bonding layer. In this case, the first layer 151 can be made of an adhesive.

For example, the light emitting device package 150 can be transferred onto the donor substrate in an inverted state. In this case, the third layer 159 of the light emitting device package 150 can contact the surface of the donor substrate. Thereafter, the light emitting device package 150 on the donor substrate can be transferred onto the display substrate 200. In this case, the first layer 151 of the light emitting device package 150 can contact the surface of the display substrate 200. When the display substrate 200 has the grooves 203, the first layer 151 of the light emitting device package 150 can come into contact with the bottom surface of the grooves 203 of the display substrate 200. Since the first layer 151 of the light emitting device package 150 is made of an adhesive, the first layer 151 of the light emitting device package 150 can be easily adhered to the bottom surface of the grooves 203 of the display substrate 200.

Although the first layer 151 will be described with reference to FIG. 17, contact holes 240 can be formed in which the plurality of connection lines 210R, 210G, 210B, and 210C for connecting the plurality of signal lines VDD_R, VDD_G, VDD_B, VSS and the plurality of electrode pads 153R, 153G, 153B, and 153C are disposed. In order to easily form the contact hole 240, the first layer 151 can be made of a material that is easily etched locally.

The plurality of light emitting devices 150R, 150G, and 150B can be disposed on the first layer 151.

The plurality of light emitting devices 150R, 150G, and 150B can be horizontally spaced apart from each other and disposed.

In the drawing, the light emitting devices 150R, 150G, and 150B can be horizontal light emitting devices provided with a first electrode and a second electrode on the side from which light is emitted, but can also be a flip chip type light emitting device or a vertical light emitting device. The horizontal type light emitting device can have a flipped type in that the first electrode and the second electrode are provided on the same side of the flip chip type light emitting device. In the vertical type light emitting device, a first electrode can be disposed on a lower side and a second electrode can be disposed on an upper side.

The light emitting device package 150 can have a first region and a second region surrounding the first region. The first area can be a center area, and the second area can be an edge area, an outer area, or an edge area.

The plurality of light emitting devices 150R, 150G, and 150B can be disposed in the first region of the light emitting device package 150.

Each of the plurality of light emitting devices 150R, 150G, and 150B can include at least one or more first semiconductor layers including a first dopant, an active layer, at least one or more second semiconductor layers including a second dopant, a first electrode, and a second electrode. The light emitting devices 150R, 150G, and 150B can include more components than these.

The first semiconductor layer, the active layer, and the second semiconductor layer can include an inorganic semiconductor material. For example, the first semiconductor layer, the active layer, and the second semiconductor layer can include a group II-IV compound or a group III-V compound.

For example, the first semiconductor layer can be a p-type semiconductor layer and the second semiconductor layer can be an n-type semiconductor layer, but is not limited thereto. The first dopant can be a p-type dopant, and the second dopant can be an n-type dopant, but is not limited thereto.

The active layer can generate light by recombination of the first dopant of the first semiconductor layer and the second dopant of the second semiconductor layer. In this case, the wavelength of light can be determined according to the band gap of the compound semiconductor material constituting the active layer. As the band gap of the compound semiconductor material increases, shorter wavelength light is generated, and as the band gap of the compound semiconductor material decreases, longer wavelength light can be generated.

The first electrode can be disposed on the first semiconductor layer, and the second electrode can be disposed on the second semiconductor layer. The intensity of light generated in the active layer can be determined according to a current corresponding to a voltage applied to the first electrode and the second electrode.

In the drawing, each of the plurality of light emitting devices 150R, 150G, and 150B can have a rectangular shape when viewed from above, and can have a circular shape, an elliptical shape, a star shape, a polygonal shape, and the like.

In the drawing, each of the plurality of light emitting devices 150R, 150G, and 150B is spaced apart from each other along one direction, but is not limited thereto.

The plurality of light emitting devices can include the first light emitting device 150R, the second light emitting device 150G, and the third light emitting device 150B, but more light emitting devices can be further included. For example, a white light emitting device can be further included.

The plurality of electrode pads 153R, 153G, 153B, and 153C can surround the plurality of light emitting devices 150R, 150G, and 150B.

The plurality of electrode pads 153R, 153G, 153B, and 153C can electrically connect the plurality of light emitting devices 150R, 150G, and 150B to the plurality of signal lines VDD_R, VDD_G, VDD_B, and VSS of the substrate 200. To this end, the plurality of electrode pads 153R, 153G, 153B, and 153C can be electrically connected to the plurality of light emitting devices 150R, 150G, and 150B through the plurality of connection electrodes 157R, 157G, 157B, and 157C. In addition, the plurality of electrode pads 153R, 153G, 153B, and 153C can be electrically connected to the plurality of signal lines VDD_R, VDD_G, VDD_B, and VSS through a plurality of connection lines 210R, 210G, 210B, and 210C.

Accordingly, light can be emitted from each of the plurality of light emitting devices 150R, 150G, and 150B by a current corresponding to a voltage applied through the plurality of electrode pads 153R, 153G, 153B, and 153C.

The plurality of electrode pads 153R, 153G, 153B, and 153C can be disposed in the second region of the light emitting device package 150, that is, the edge region.

Since the plurality of light emitting devices 150R, 150G, and 150B are disposed in the first region, that is, the central region, the plurality of electrode pads 153R, 153G, 153B, and 153C can surround the plurality of light emitting devices 150R, 150G, and 150B. The plurality of electrode pads 153R, 153G, 153B, and 153C can be disposed along the periphery of all of the plurality of light emitting devices 150R, 150G, and 150B.

For example, each of the plurality of electrode pads 153R, 153G, 153B, and 153C can have an annular shape. For example, each of the plurality of electrode pads 153R, 153G, 153B, and 153C can have a ring shape.

For example, the plurality of electrode pads 153R, 153G, 153B, and 153C can be spaced apart enough not to interfere with each other electrically. For example, the width W of the plurality of electrode pads 153R, 153G, 153B, and 153C can be greater than the separation distance L between the plurality of electrodes, but is not limited thereto.

For example, a plurality of electrode pads 153R, 153G, 153B, and 153C can be disposed on the first layer 151. For example, the plurality of electrode pads 153R, 153G, 153B, and 153C can be disposed on the same layer as the plurality of light emitting devices 150R, 150G, and 150B. That is, the plurality of light emitting devices 150R, 150G, and 150B and the plurality of electrode pads 153R, 153G, 153B, and 153C can be disposed on the first layer 151.

The plurality of electrode pads can include a first electrode pad 153R, a second electrode pad 153G, a third electrode pad 153B, and a fourth electrode pad 153C. For example, the first electrode pad 153R can be a red electrode pad, the second electrode pad 153G can be a green electrode pad, the third electrode pad 153B can be a blue electrode pad, and the fourth electrode pad 153C can be a common electrode pad.

For example, the fourth electrode pad 153C can be disposed along the periphery of the plurality of light emitting devices 150R, 150G, and 150B. For example, the first electrode pad 153R can be disposed along the circumference of the fourth electrode pad 153C. For example, the second electrode pad 153G can be disposed along the circumference of the first electrode pad 153R. A third electrode pad 153B can be disposed along the circumference of the second electrode pad 153G. Accordingly, the diameter of the second electrode pad 153G can be greater than that of the first electrode pad 153R, and the diameter of the third electrode pad 153B can be greater than that of the second electrode pad 153G. Here, the diameter can be an inner diameter or an outer diameter.

For example, the widths W of each of the plurality of electrode pads 153R, 153G, 153B, and 153C can be different from each other. For example, as the diameter of the electrode pad 153R, 153G, 153B, and 153C increases, the internal resistance increases and current flow is hindered. Therefore, the width W of the electrode pads 153R, 153G, 153B, and 153C can increase as the diameter of the electrode pad increases. For example, the width of the first electrode pad 153R can be greater than that of the fourth electrode pad 153C.

In the drawing, although shown as being disposed in the order of the fourth electrode pad 153C, the first electrode pad 153R, second electrode pad 153G and third electrode pad 153B along the radial direction from the center of the light emitting device package 150, the arrangement order of these electrode pads 153R, 153G, 153B, and 153C can be changed.

The first electrode pad 153R is electrically connected to one side of the first light emitting device 150R, for example, to the second electrode, and the second electrode pad 153G can be electrically connected to one side of the second light emitting device 150G, for example, the second electrode. The third electrode pad 153B is electrically connected to one side of the third light emitting device 150B, for example, to the second electrode, and the fourth electrode pad 153C can be commonly connected to the first light emitting device 150R, the second light emitting device 150G, and the third light emitting device 150B.

For example, a plurality of contact holes 221 to 226 and 231 to 235 can be formed in the second layer 155. These contact holes 221 to 226 and 231 to 235 can be formed by partially etching the second layer 155.

For example, the first contact hole 221 and the second contact hole 222 can be formed by vertically etching the second layer 155 corresponding to each of the first electrode and the second electrode of the first light emitting device 150R. For example, the third contact hole 223 and the fourth contact hole 224 can be formed by vertically etching the second layer 155 corresponding to each of the first electrode and the second electrode of the second light emitting device 150G. For example, the fifth contact hole 225 and the sixth contact hole 226 can be formed by vertically etching the second layer 155 corresponding to each of the first electrode and the second electrode of the third light emitting device 150B.

For example, a seventh contact hole 231 is formed by vertically etching the second layer 155 corresponding to one region of the first electrode pad 153R. An eighth contact hole 232 is formed by vertically etching the second layer 155 corresponding to one region of the second electrode pad 153G. A ninth contact hole 233 can be formed by vertically etching the second layer corresponding to one region of the third electrode pad 153B. In addition, at least one tenth contact hole 234 or 235 can be formed by vertically etching the second layer 155 corresponding to at least one region of the fourth electrode pad 153C.

A plurality of connection electrodes 157R, 157G, 157B, and 157C are disposed in the first to tenth contact holes 221 to 226 and 231 to 235, and the plurality of light emitting devices 150R, 150G, and 150B can be electrically connected to the plurality of electrode pads 153R, 153G, 153B, and 153C by the plurality of connection electrodes 157R, 157G, 157B, and 157C.

Although the drawing shows a plurality of electrode pads 153R, 153G, 153B, and 153C arranged horizontally, but the plurality of electrode pads 153R, 153G, 153B, and 153C can be vertically arranged in different layers. In this case, the plurality of electrode pads 153R, 153G, 153B, and 153C can or may not overlap vertically. When the plurality of electrode pads 153R, 153G, 153B, and 153C are vertically overlapped, the size of the light emitting device package 150 can be further reduced, so that the size of a unit pixel can be reduced, so that higher resolution can be realized.

The second layer 155 can be disposed on the plurality of light emitting devices 150R, 150G, and 150B.

The second layer 155 can be a planarization layer having a uniform thickness. A plurality of light emitting devices 150R, 150G, and 150B and a plurality of pad electrodes can be buried by the second layer 155.

Although the thickness of each of the plurality of pad electrodes is smaller than the thickness of each of the plurality of light emitting devices 150R, 150G, and 150B in the drawing, but the thickness of each of the plurality of pad electrodes can be equal to or greater than the thickness of each of the plurality of light emitting devices 150R, 150G, and 150B. In this case, the upper surface of the second layer 155 can be located higher than the upper surface of a component having a greater thickness among the plurality of electrode pads 153R, 153G, 153B, and 153C and the plurality of light emitting devices 150R, 150G, and 150B from the upper surface of the first layer 151.

As described above, a plurality of contact holes 221 to 226 and 231 to 235 can be formed in the second layer 155. In order to easily form the contact holes 221 to 226 and 231 to 235, the second layer 155 can be made of a material that is easily etched locally.

Heat can be generated from each of the plurality of light emitting devices 150R, 150G, and 150B. Accordingly, the second layer 155 can be made of an excellent heat dissipation material capable of easily dissipating heat generated from each of the plurality of light emitting devices 150R, 150G, and 150B to the outside.

The plurality of light emitting devices 150R, 150G, and 150B and/or the plurality of electrode pads 153R, 153G, 153B, and 153C can be spaced apart from each other at very narrow intervals and electrically shorted. Therefore, the second layer 155 is between the plurality of light emitting devices 150R, 150G, 150B, the second layer can be made of an excellent insulating material for insulation between the plurality of light emitting devices 150R, 150G, 150B, between the plurality of electrode pads 153R, 153G, 153B, 153C, or between each of the plurality of light emitting devices 150R, 150G, and 150B and each of the plurality of electrode pads 153R, 153G, 153B, and 153C.

In order for the second layer 155 to serve as a planarization layer, it should be easily formed in thickness. Accordingly, the second layer 155 can be made of a material that is easy to form a thickness.

The plurality of connection electrodes 157R, 157G, 157B, and 157C can be disposed on the second layer.

For example, the plurality of connection electrodes 157R, 157G, 157B, and 157C can be made of a transparent conductive material such as ITO or IZO. For example, the plurality of connection electrodes 157R, 157G, 157B, and 157C can be made of a metal such as copper (Cu), aluminum (Al), gold (Au) or an alloy thereof.

The plurality of connection electrodes 157R, 157G, 157B, and 157C can be formed in the plurality of contact holes 221 to 226 and 231 to 235 formed in the second layer 155. Each of the plurality of connection electrodes 157R, 157G, 157B, and 157C can electrically connect each of the plurality of light emitting devices 150R, 150G, and 150B to each of the plurality of electrode pads 153R, 153G, 153B, and 153C. In this case, each of the plurality of connection electrodes 157R, 157G, 157B, and 157C can vertically overlap at least one electrode pad among the plurality of electrode pads 153R, 153G, 153B, and 153C.

Specifically, the first connection electrode 157R is electrically connected to the second electrode of the first light emitting device 150R through the first contact hole 221, and can be electrically connected to the first electrode pad 153R through the seventh contact hole 231.

The second connection electrode 157G is electrically connected to the second electrode of the second light emitting device 150G through the third contact hole 223, and can be electrically connected to the second electrode pad 153G through the eighth contact hole 232.

The third connection electrode 157B is electrically connected to the second electrode of the third light emitting device 150B through the fifth contact hole 225, and can be electrically connected to the third electrode pad 153B through the ninth contact hole 233.

The fourth connection electrode 157C is commonly connected to the first electrode of the first light emitting device 150R, the first electrode of the second light emitting device 150G, and the first electrode of the third light emitting device 150B through the second contact hole 222, the fourth contact hole 224, and the sixth contact hole 226, respectively.

The third layer 159 can be disposed on the plurality of connection electrodes 157R, 157G, 157B, and 157C.

The third layer 159 can be a protective layer that protects the plurality of light emitting devices 150R, 150G, and 150B, the plurality of electrode pads 153R, 153G, 153B, and 153C, a plurality of connection electrodes 157R, 157G, 157B, 157C and the like. By the protective layer, an electrical short between the plurality of connection electrodes 157R, 157G, 157B, and 157C due to external foreign substances is prevented, and the plurality of light emitting devices 150R, 150G, and 150B can be affected by moisture or corrosion of the plurality of electrode pads 153R, 153G, 153B, and 153C and the plurality of connection electrodes 157R, 157G, 157B, and 157C can be prevented.

Display Device of the Embodiment

FIG. 17 is a cross-sectional view of a display device according to an embodiment.

Referring to FIGS. 6 and 17, the display device 100 according to the embodiment can include a substrate 200, a light emitting device package 150, and a plurality of signal lines VDD_R, VDD_G, VDD_B, and VSS.

The substrate 200 can be a support member for supporting the light emitting device package 150 or the plurality of signal lines VDD_R, VDD_G, VDD_B, and VSS. The substrate 200 can be a protective member for protecting the light emitting device package 150 or the plurality of signal lines VDD_R, VDD_G, VDD_B, and VSS. The substrate 200 can be an emitting member for emitting heat generated in the light emitting device package 150 to the outside. The substrate 200 can be an insulating member to prevent an electrical short between the light emitting device package 150 or the plurality of signal lines VDD_R, VDD_G, VDD_B, and VSS.

The substrate 200 can have rigid, flexible, bendable, rollable, or stretchable characteristics, but is not limited thereto.

The substrate 200 can include a plurality of grooves 203. These grooves 203 can be arranged in a matrix form.

The grooves 203 can be formed by the insulating member 206. For example, after the insulating member 206 is formed on the substrate 200, the grooves 203 arranged in a matrix can be formed by performing local etching on a plurality of regions of the insulating member 206.

Although the drawing shows that the insulating member 206 is completely removed from the upper surface to the lower surface, the grooves 203 partially exposed on the upper surface of the substrate 200 is formed, but the upper surface of the substrate 200 may not be exposed. That is, the grooves 203 can be formed in a state in which a certain portion of the lower side of the insulating member 206 remains by being etched from the upper surface to the lower surface of the insulating member 206. In the case where the top surface of the substrate 200 is exposed, the bottom of the grooves 203 can be the exposed top surface of the substrate 200.

For example, the depth of the grooves 203 can be equal to or smaller than the thickness of the light emitting device package 150. Accordingly, when the light emitting device package 150 is inserted into the grooves 203, the upper surface of the light emitting device package 150 can be positioned the same as or higher than the upper surface of the grooves 203.

Meanwhile, during self-assembly, the light emitting device package 150 should be fixed or maintained in the grooves 203. If the light emitting device package 150 is not fixed to the grooves 203, the corresponding light emitting device package 150 is separated from the grooves 203 and there is no light emitting device package 150 in the corresponding grooves 203, which can cause a light emitting defect.

The first wiring line 201 and the second wiring line 202 can be disposed on the substrate 200 so that the light emitting device package 150 is fixed or maintained in the grooves 203. The first wiring line 201 and the second wiring line 202 can be spaced apart from each other. For example, the distance between the first wiring line 201 and the second endorsement line can be greater than the width of the grooves 203. For example, the distance between the first wiring line 201 and the second wiring line 202 can be greater than the width of the light emitting device package 150 inserted into the grooves 203. In other words, the light emitting device package 150 inserted into the grooves 203 can be disposed between the first wiring line 201 and the second wiring line 202. Therefore, a dielectrophoretic force is generated between the first wiring line 201 and the second wiring line 202 by the voltage applied to the first wiring line 201 and the second wiring line 202, and the light emitting device package 150 inserted into the grooves 203 can be fixed or held in the grooves 203 by dielectrophoretic force.

As described above, the light emitting device package 150 can be inserted into the grooves 203. During self-assembly, as shown in FIG. 5, as the assembly device 1100 including the magnetic material moves along the substrate 200, the light emitting device packages 150 put into the fluid can be moved in the same direction as the assembly device 1100. That is, the light emitting device packages 150 can be moved toward the assembling device 1100 by applying an attractive force to the light emitting device packages 150 by the assembling device 1100.

A magnetic layer can be provided on the light emitting device package 150 so that an attractive force acts on the light emitting device package 150. The magnetic layer is magnetized by the assembly device 1100 and exerts an attractive force on the assembly device, and can be, for example, nickel (Ni), but is not limited thereto.

For example, the magnetic layer can be provided in at least one light emitting device among the plurality of light emitting devices 150R, 150G, and 150B of the light emitting device package 150. When each of the light emitting devices 150R, 150G, and 150B includes a first semiconductor layer, an active layer, and a second semiconductor layer, the magnetic layer can be disposed below the first semiconductor layer and/or above the second semiconductor layer. For example, when the first electrode is disposed on the first semiconductor layer and the second electrode is disposed on the second semiconductor layer, the magnetic layer can be disposed between the first electrode and the first semiconductor layer and/or between the second semiconductor layer and the second electrode. When the first electrode or the second electrode includes a plurality of metal layers, at least one metal layer among the plurality of metal layers can be a magnetic layer.

The light emitting device package 150 shown in FIG. 13 can be inserted into the grooves 203 in an inverted state.

That is, the light emitting device package 150 shown in FIG. 13 can be inserted into the grooves 203 in a state of being rotated 180 degrees.

During self-assembly, the substrate 200 shown in FIG. 17 can be positioned above the chamber 1300 shown in FIG. At this time, the grooves 203 of the substrate 200 can be positioned to face the inside of the chamber. A plurality of light emitting device packages 150 can be dropped into the fluid in the chamber. The assembly device 1100 can be positioned on the substrate 200.

A magnetic layer can be disposed between the second semiconductor layer and the second electrode and/or on the second electrode so that the light emitting device package 150 is inserted into the grooves 203 in an inverted state.

Therefore, as the assembling device 1100 moves along the substrate 200 in a straight direction or a rotational direction, the light emitting device packages 150 located under the substrate 200 can be moved toward the assembly device 1100. That is, when the region where the second electrode of the light emitting device package 150 is located moves along the assembly device 1100 and meets the grooves 203, it can be inserted into the grooves 203. Accordingly, an area where the second electrode of the light emitting device package 150 is located can face the bottom surface of the grooves 203. In this case, one surface of the third layer 159 of the light emitting device package 150 is in contact with the bottom surface of the grooves 203, and disposed on the side surface of the light emitting device package 150 to face the inner surface of the grooves 203. One surface of the first layer 151 of the light emitting device package 150 can be positioned at the same level as or higher than the surface of the grooves 203. The side of the light emitting device package 150 can be spaced apart from the inner side of the grooves 203, but is not limited thereto.

For example, when the size of the grooves 203 is the same as the size of the light emitting device package 150, the side surface of the light emitting device package 150 can come into contact with the inner surface of the grooves 203. For example, when the size of the grooves 203 is larger than the size of the light emitting device package 150, the side surface of the light emitting device package 150 can be spaced apart from the inner surface of the grooves 203.

When the light emitting device package 150 is inserted into the grooves 203 by self-assembly, the plurality of signal lines VDD_R, VDD_G, VDD_B, and VSS can be electrically connected to the plurality of electrode pads 153R, 153G, 153B, and 153C of the light emitting device package 150 through a plurality of connection lines 210R, 210G, 210B, and 210C.

For example, the plurality of connection lines 210R, 210G, 210B, and 210C can be made of a transparent conductive material such as ITO or IZO. For example, the plurality of connection lines 210R, 210G, 210B, and 210C can be made of a metal such as copper (Cu), aluminum (Al), gold (Au) or an alloy thereof.

The plurality of connection lines 210R, 210G, 210B, and 210C can be disposed on the first layer 151. The first layer 151 of the light emitting device package 150 can be locally etched to form a plurality of contact holes 240. A plurality of connection lines 210R, 210G, 210B, and 210C can be formed in the plurality of contact holes 240.

The plurality of electrode pads 153R, 153G, 153B, and 153C can be connected to the plurality of signal lines VDD_R, VDD_G, VDD_B, and VSS through a plurality of connection lines 210R, 210G, 210B, and 210C formed in the contact hole 240. As shown in FIGS. 6 and 17, the first electrode pad 153R can be connected to the first signal line VDD_R through the first connection line 210R formed in the first contact hole 240. The second electrode pad 153G can be connected to the second signal line VDD_G through a second connection line 210G formed in a second contact hole (not shown). The third electrode pad 153B is connected to the third signal line VDD_B through a third connection line 210B formed in a third contact hole (not shown), and the fourth electrode pad 153C can be connected to the fourth signal line VSS through a fourth connection line 210C formed in a fourth contact hole (not shown).

The plurality of connection lines 210R, 210G, 210B, and 210C can be arranged on the substrate 200 and the light emitting device package 150 to form the shortest path between the plurality of signal lines VDD_R, VDD_G, VDD_B, and VSS of the substrate 200 and the plurality of electrode pads 153R, 153G, 153B, and 153C of the light emitting device package 150.

Meanwhile, when the plurality of connection lines 210R, 210G, 210B, and 210C are formed on the third layer 159 of the light emitting device package 150, the plurality of connection lines 210R, 210G, 210B, and 210C can be electrically shorted with the plurality of connection lines 210R, 210G, 210B, and 210C already formed in the third layer 159 and the second layer 155.

However, according to the embodiment, during self-assembly, by guiding the third layer of the light emitting device package 150 on which the plurality of connection electrodes are disposed toward the bottom surface of the grooves 203, the third layer is in contact with the bottom surface of the grooves 203, and forming a plurality of connection lines 210R, 210G, 210B, 210C in the first layer 151 located on the opposite side of the third layer 159, since the plurality of connection lines 210R, 210G, 210B, and 210C are not electrically shorted with the plurality of connection electrodes 157R, 157G, 157B, and 157C formed on the second layer 155, electrical connection failure can be prevented.

Meanwhile, the inner surface of the grooves 203 can have a lower side and an upper side. The lower side can be in contact with the bottom surface. The shape of the bottom surface can be the same as that of the grooves 203. For example, the bottom surface can have a circular shape, but is not limited thereto.

For example, a region between the lower side and the upper side can have a vertical surface having the same size as the upper side. That is, the vertical plane can be a plane perpendicular to the bottom plane. In this case, the outer surface of the light emitting device package can also have a vertical surface perpendicular to the rear surface of the light emitting device package 150.

As another example, a region between the lower side and the upper side can have an inclined surface having an upper side larger than a lower side. For example, the size of the grooves 203 can gradually increase from the lower side to the upper side. In this case, the outer surface of the light emitting device package 150 can also have an inclined surface with respect to the rear surface of the light emitting device package 150. For example, outer surfaces of each of the first layer 151, the second layer 155, and the third layer 159 can have an inclined surface. In this case, the size of the third layer 159 contacting the bottom surface of the grooves 203 can be the smallest, the size of the second layer 155 can be greater than that of the third layer 159, and the size of the first layer 151 can be greater than that of the second layer 155. Accordingly, as the inner surface of the grooves 203 have an inclined surface that increases from the lower side to the upper side, the light emitting device package 150 can be more easily assembled into the grooves 203.

Meanwhile, the arrangement positions of the plurality of light emitting devices 150R, 150G, and 150B and/or the plurality of connection electrodes 157R, 157G, and 157B of the light emitting device package 150 disposed in each of the plurality of grooves 203 of the display device 100 according to the embodiment can be different.

The plurality of light emitting devices 150R, 150G, and 150B and the plurality of connection electrodes 157R, 157G, and 157B shown in FIG. 12 can be disposed in the first grooves 203 of the display device 100. That is, the plurality of light emitting devices 150R, 150G, and 150B can be lengthy disposed in the vertical direction, and the plurality of connection electrodes 157R, 157G, and 157B can be disposed in one region on the upper side of the light emitting device package 150. In the second grooves 203 of the display device 100, a plurality of light emitting devices 150R, 150G, and 150B are disposed elongated along the left and right directions, and a plurality of connection electrodes 157R, 157G, and 157B can be disposed in one region of the left side of the light emitting device package 150.

As another example, the arrangement positions of the plurality of light emitting devices 150R, 150G, and 150B and/or the plurality of connection electrodes 157R, 157G, and 157B of the light emitting device package 150 disposed in each of the plurality of grooves 203 of the display device 100 according to the embodiment can be the same.

The above detailed description should not be construed as limiting in all respects and should be considered as illustrative. The scope of the embodiments should be determined by reasonable interpretation of the appended claims, and all changes within the equivalent range of the embodiments are included in the scope of the embodiments.

INDUSTRIAL APPLICABILITY

The embodiment can be adopted in the display field for displaying images or information.

The invention claimed is:

1. A display device comprising:

a substrate comprising a plurality of grooves;

a light emitting device package disposed in each of the plurality of grooves;

a plurality of signal lines disposed adjacent to each of the plurality of grooves; and a plurality of connection lines connecting the plurality of signal lines and a plurality of light emitting device packages including the light emitting device package, wherein the light emitting device package comprises a first layer, a plurality of light emitting devices on the first layer, and a plurality of electrode pads surrounding the plurality of light emitting devices.

2. The display device according to claim 1, wherein the plurality of grooves have a circular shape, and wherein the light emitting device package has a has the circular shape corresponding to the plurality of grooves.

3. The display device according to claim 2, wherein the plurality of electrode pads have an annular shape.

4. The display device according to claim 1, wherein one of the plurality of electrode pads is configured to be a common electrode pad commonly connected to the plurality of light emitting devices, one of the plurality of signal lines is configured to be a common signal line disposed along a first direction and connected to the common electrode pad, and wherein among the plurality of signal lines, remaining signal lines are disposed along a second direction crossing the first direction.

5. The display device according to claim 1, wherein the light emitting device package comprises a second layer on the plurality of light emitting devices, a plurality of connection electrodes disposed on the second layer to connect between the plurality of light emitting devices and the plurality of electrode pads, and a third layer on the plurality of connection electrodes.

6. The display device according to claim 5, wherein an arrangement position of the plurality of light emitting devices of each of the plurality of light emitting device packages is different for each of the plurality of grooves.

7. The display device according to claim 5, wherein each arrangement positions of the plurality of connection electrodes is different for each of the plurality of grooves.

8. The display device according to claim 5, wherein the third layer is in contact with a bottom surface of the plurality of grooves.

9. The display device according to claim 5, wherein each of the plurality of connection electrodes vertically overlaps at least one electrode pad among the plurality of electrode pads.

10. The display device according to claim 1, wherein each of the plurality of connection lines penetrates the first layer and is connected to the plurality of electrode pads.

11. The display device according to claim 1, wherein each of the plurality of connection lines vertically overlaps at least one electrode pad among the plurality of electrode pads.

12. The display device according to claim 1, wherein a shape of each of the plurality of light emitting devices has one of a circular shape, an elliptical shape and a quadrangular shape.

13. The display device of claim 1, wherein the light emitting device package has a circular planar shape, and a groove of the plurality of grooves has a circular shape corresponding to the circular planar shape of the light emitting device package such that the light emitting device package is insertable into the groove irrespective of a rotational orientation.

14. The display device of claim 13, wherein the light emitting device package is configured to be self-assembled into the groove with a 360-degree rotational freedom.

15. The display device of claim 1, wherein the light emitting device package further comprises:

a second layer disposed on the plurality of light emitting devices and the plurality of electrode pads; and a third layer disposed on the second layer and including a connection electrode.

16. The display device of claim 15, wherein the plurality of electrode pads each have an annular shape such that at least a portion of each electrode pad electrically contacts a corresponding signal line even when the light emitting device package is misaligned with respect to the groove of the plurality of grooves.

17. The display device of claim 15, wherein the connection electrode is disposed on a side opposite to a connection line connected to the plurality of electrode pads so as to electrically isolate the connection electrode from the connection line.

18. The display device of claim 1, wherein the plurality of light emitting devices comprise red, green, and blue light emitting devices disposed in a single light emitting device package of the plurality of light emitting device packages and configured to be collectively self-assembled into a groove of the plurality of grooves.

* * * * *